(12) United States Patent
Ishimaru et al.

(10) Patent No.: US 12,351,913 B2
(45) Date of Patent: Jul. 8, 2025

(54) FILM FORMING APPARATUS AND FILM FORMING METHOD

(71) Applicant: Kioxia Corporation, Tokyo (JP)

(72) Inventors: Tomoki Ishimaru, Yokkaichi Mie (JP); Masaya Toda, Yokkaichi Mie (JP); Kota Takahashi, Yokkaichi Mie (JP); Kenichiro Toratani, Yokkaichi Mie (JP); Kazuhiro Matsuo, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/148,322

(22) Filed: Dec. 29, 2022

(65) Prior Publication Data
US 2023/0340667 A1 Oct. 26, 2023

(30) Foreign Application Priority Data
Apr. 25, 2022 (JP) .................. 2022-071288

(51) Int. Cl.
C23C 16/455 (2006.01)
C23C 16/40 (2006.01)
C23C 16/44 (2006.01)
C23C 16/52 (2006.01)
H01L 21/02 (2006.01)

(52) U.S. Cl.
CPC ...... C23C 16/45548 (2013.01); C23C 16/407 (2013.01); C23C 16/4412 (2013.01); C23C 16/45527 (2013.01); C23C 16/45565 (2013.01); C23C 16/52 (2013.01); H01L 21/02565 (2013.01); H01L 21/0262 (2013.01)

(58) Field of Classification Search
CPC ............ C23C 16/45548; C23C 16/407; C23C 16/4412; C23C 16/45527; C23C 16/45565; C23C 16/52; C23C 16/4558; C23C 16/45544; C23C 16/45561; H01L 21/02565; H01L 21/0262; H01L 21/02554
See application file for complete search history.

(56) References Cited

U.S. PATENT DOCUMENTS

| 7,408,225 B2 | 8/2008 | Shinriki et al. |
| 8,236,106 B2 | 8/2012 | Iizuka et al. |
| 10,121,650 B1 | 11/2018 | Kamakura |

(Continued)

FOREIGN PATENT DOCUMENTS

| CN | 104821283 A | 8/2015 |
| JP | H7-58032 A | 3/1995 |

(Continued)

*Primary Examiner* — Michael G Miller
(74) *Attorney, Agent, or Firm* — Finnegan, Henderson, Farabow, Garrett & Dunner, LLP

(57) ABSTRACT

A film forming apparatus of embodiments includes: a chamber including a sidewall; a shower head provided in an upper part of the chamber; a holder provided in the chamber holding a substrate; a first gas supply pipe supplying a first gas to the shower head; a first valve provided in the first gas supply pipe; at least one gas supply portion provided in a region of the chamber other than the shower head; a second gas supply pipe supplying a second gas to the at least one gas supply portion; a second valve provided in the second gas supply pipe; a gas exhaust pipe exhausting a gas from the chamber; and an exhaust device connected to the gas exhaust pipe.

5 Claims, 34 Drawing Sheets

(56) References Cited

U.S. PATENT DOCUMENTS

| | | |
|---|---|---|
| 10,211,110 B1 | 2/2019 | Kamakura et al. |
| 10,287,682 B2 | 5/2019 | Kikuchi et al. |
| 2005/0208217 A1 | 9/2005 | Shinriki et al. |
| 2008/0176412 A1 | 7/2008 | Komeda |
| 2009/0056626 A1 | 3/2009 | Thakur et al. |
| 2009/0229754 A1 | 9/2009 | Iizuka et al. |
| 2012/0269968 A1 | 10/2012 | Rayner, Jr. |
| 2015/0155201 A1* | 6/2015 | Sato .................... C23C 16/4412 118/696 |
| 2015/0214044 A1 | 7/2015 | Yanai et al. |
| 2017/0081764 A1 | 3/2017 | Aburatani et al. |
| 2017/0275757 A1 | 9/2017 | Kikuchi et al. |
| 2017/0345617 A1 | 11/2017 | Takeda |
| 2020/0123659 A1 | 4/2020 | Miyashita et al. |
| 2021/0020468 A1 | 1/2021 | Blomberg et al. |
| 2021/0189557 A1 | 6/2021 | Itatani et al. |

FOREIGN PATENT DOCUMENTS

| | | |
|---|---|---|
| JP | 2005-113268 A | 4/2005 |
| JP | 2008-177501 A | 7/2008 |
| JP | 5202050 B2 | 6/2013 |
| JP | 2015-206105 A | 11/2015 |
| JP | 2017-59714 A | 3/2017 |
| JP | 6613276 B2 | 11/2019 |
| JP | 6678489 B2 | 4/2020 |
| JP | 6681452 B1 | 4/2020 |
| JP | 2021-19201 A | 2/2021 |
| TW | 201812906 A | 4/2018 |
| TW | 201935561 A | 9/2019 |
| TW | 202124758 A | 7/2021 |

\* cited by examiner

FIG.14
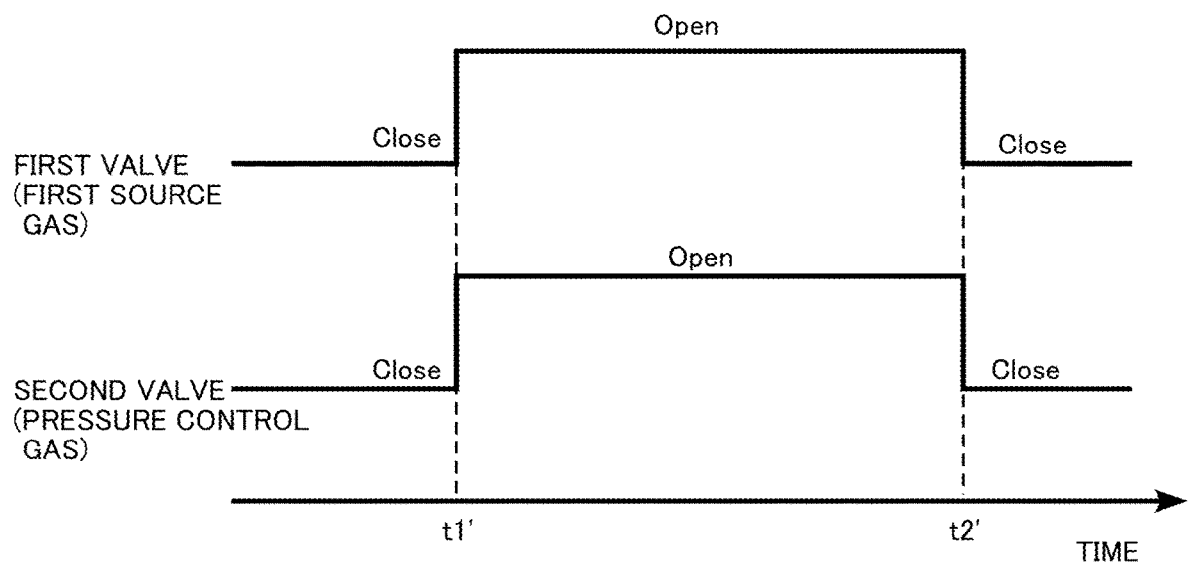
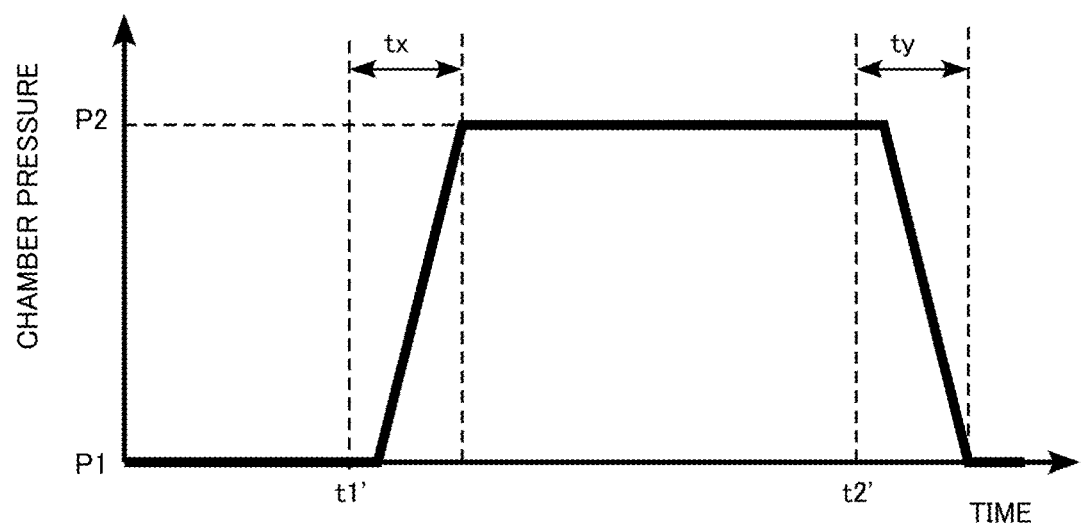

FIG.15
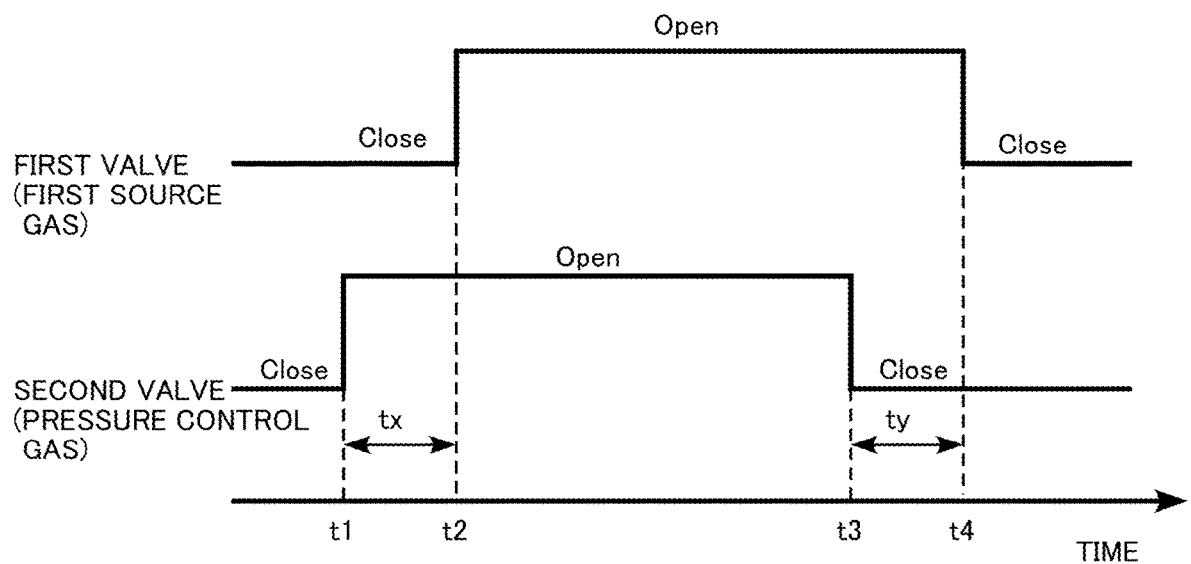
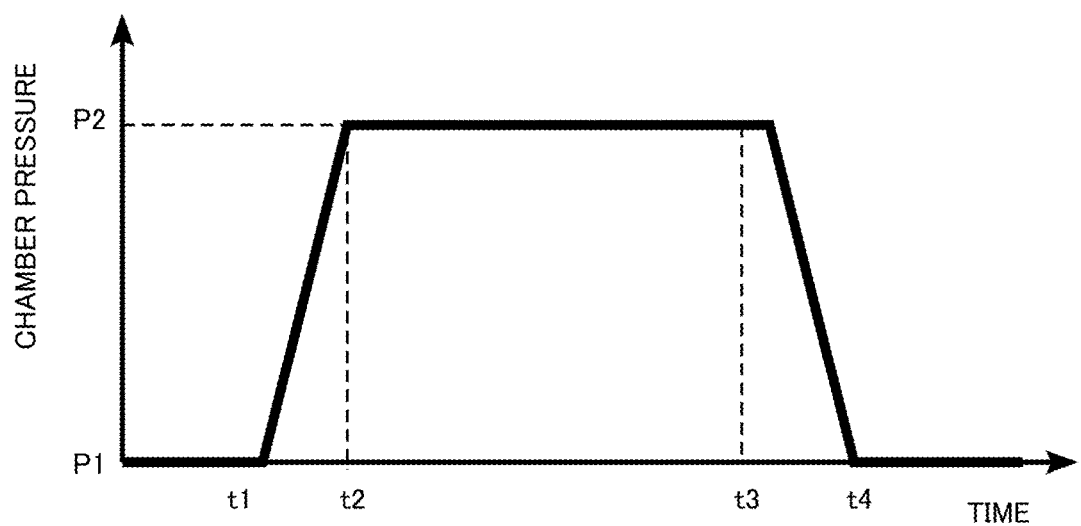

FIG.17
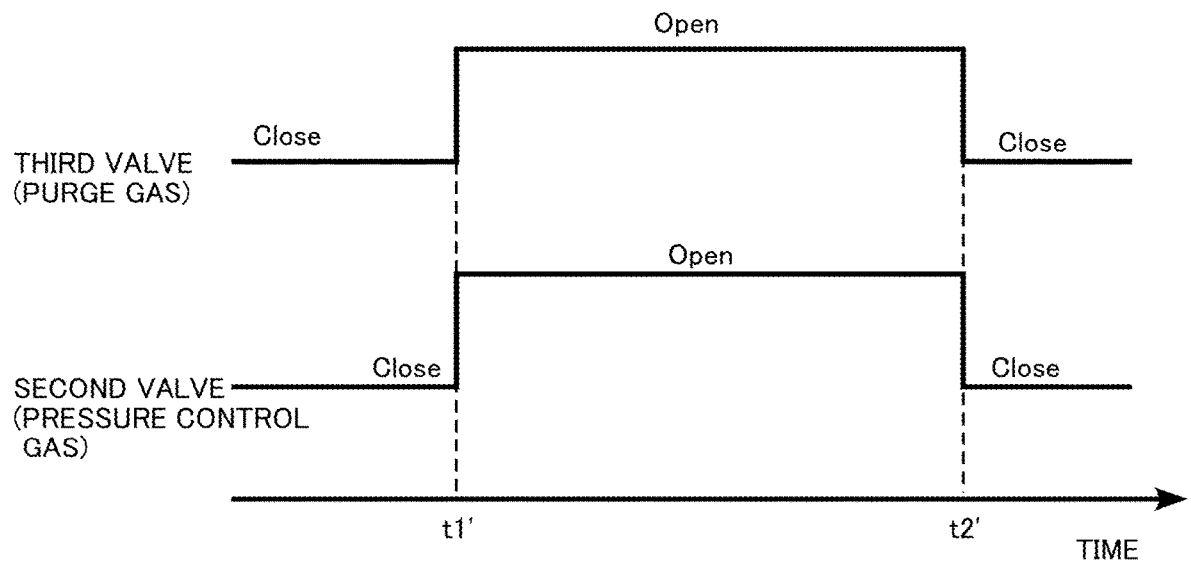
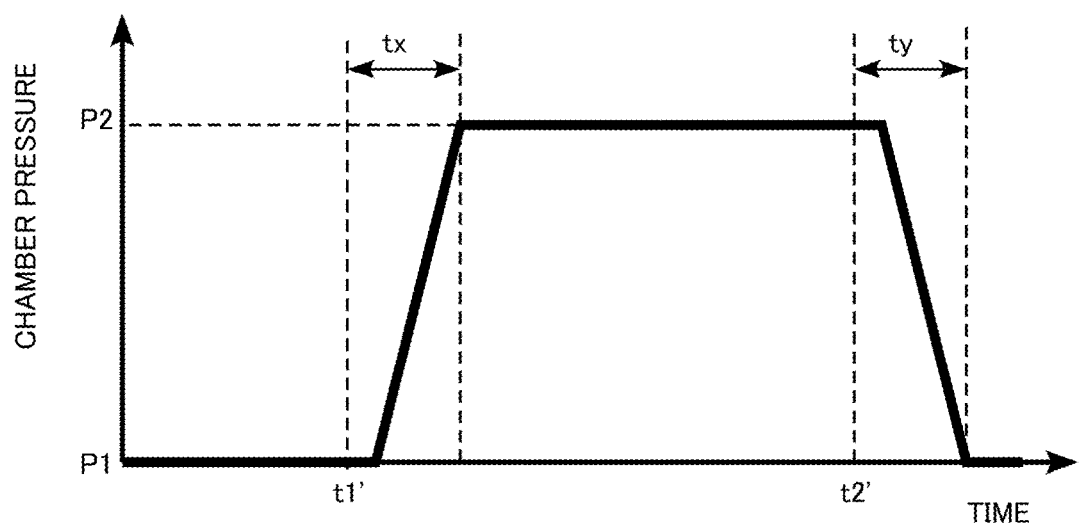

FIG.31
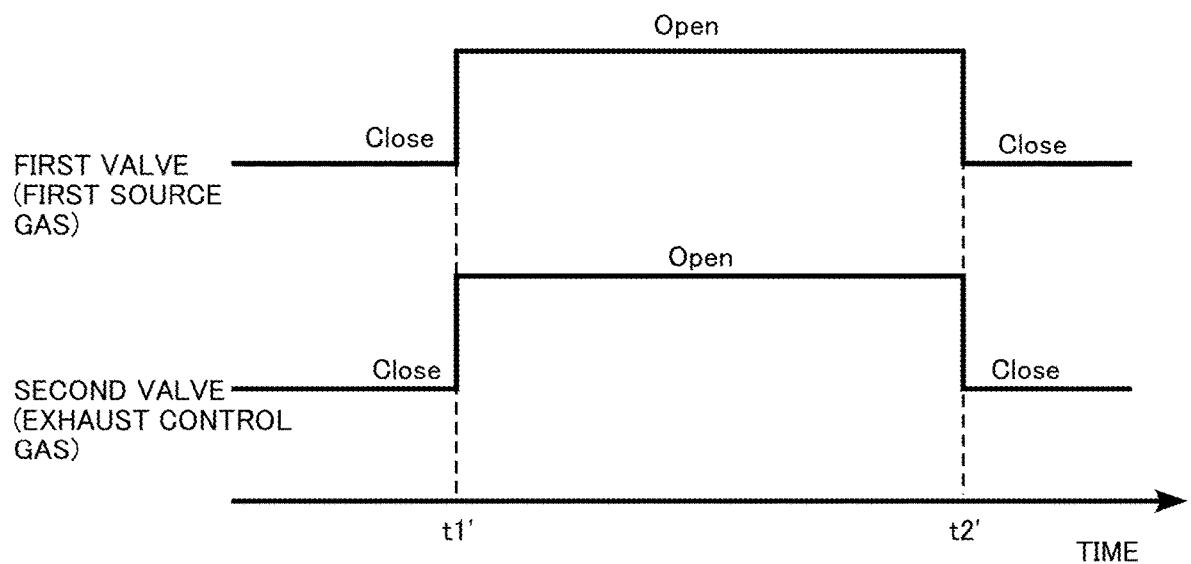
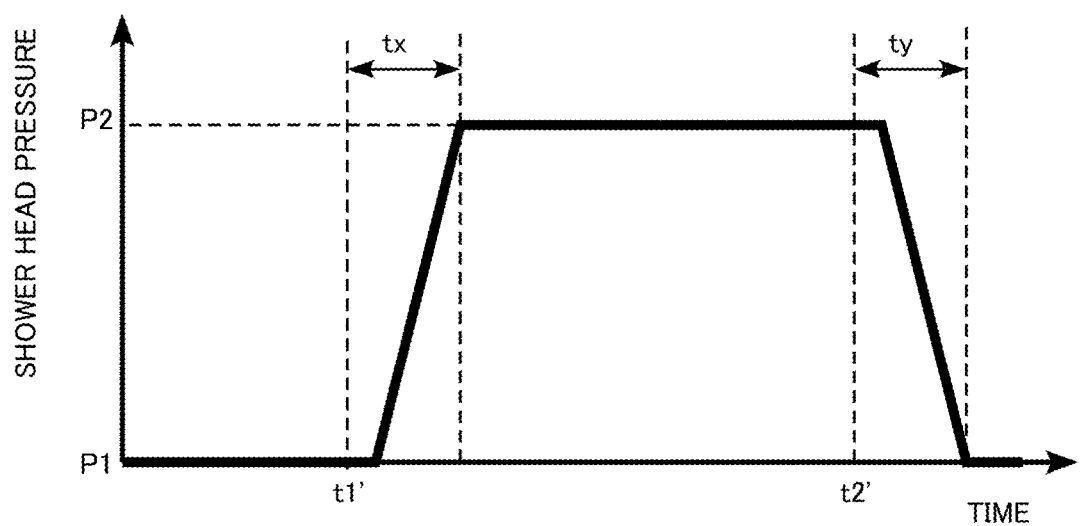

FIG.32
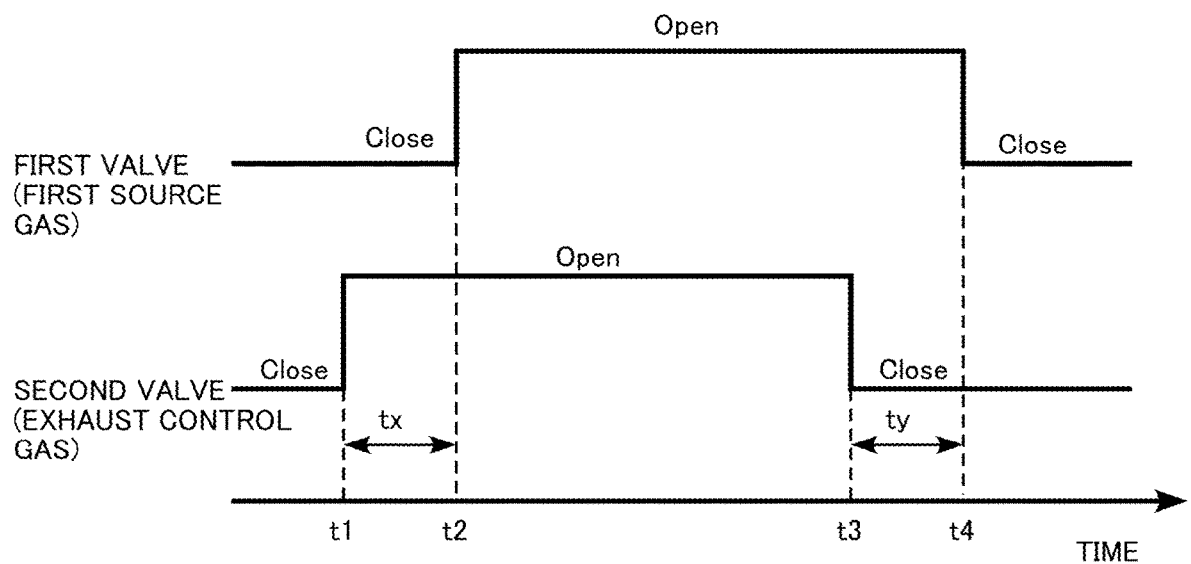
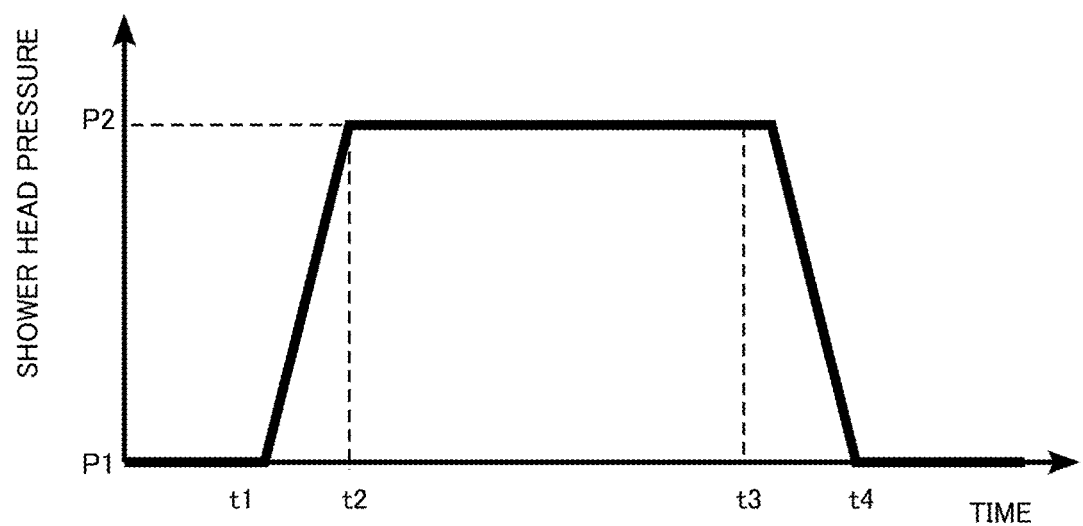

FIG.34
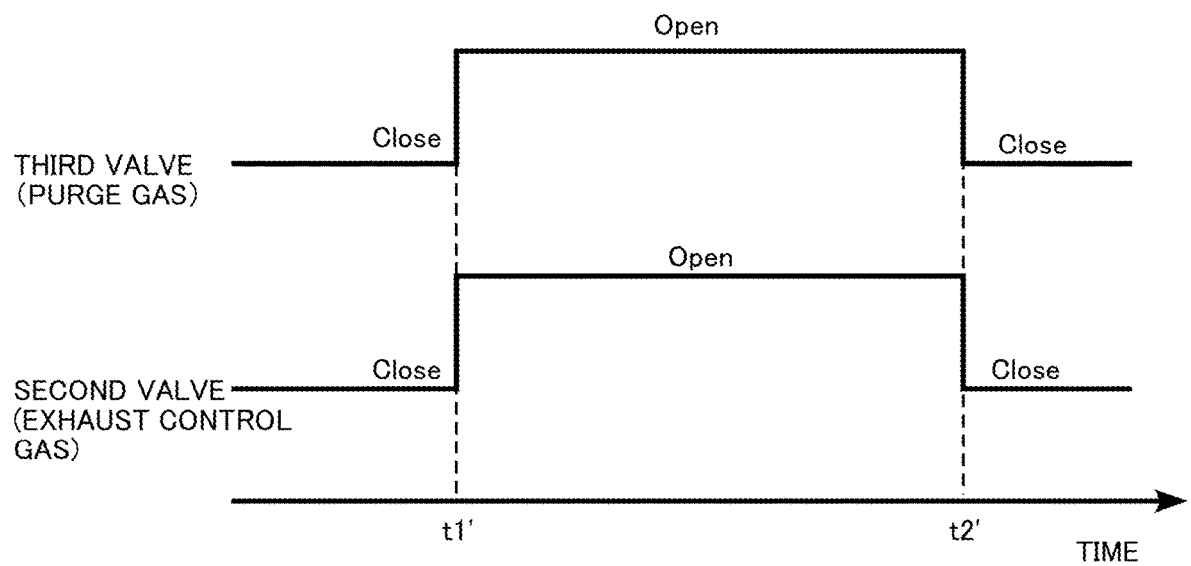
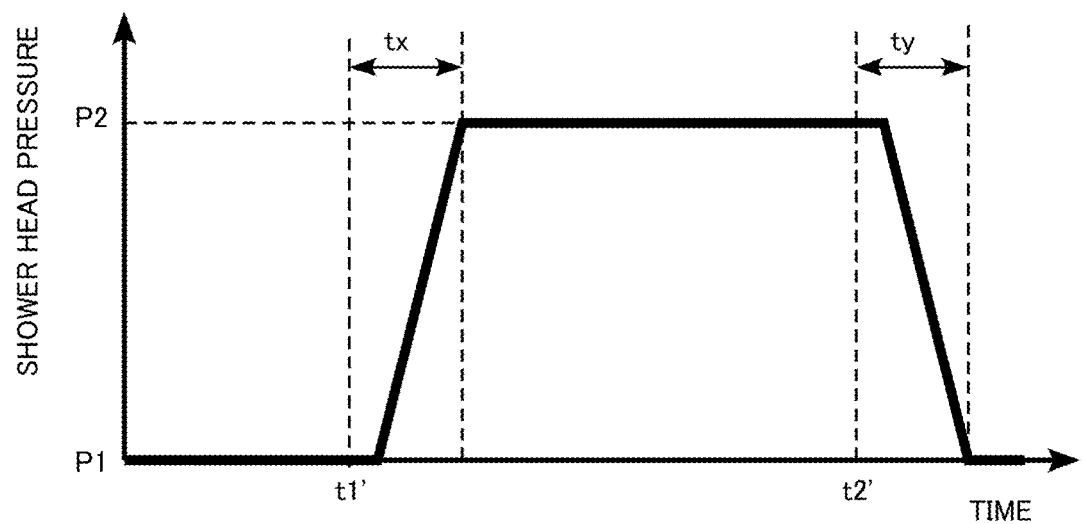

FILM FORMING APPARATUS AND FILM FORMING METHOD

CROSS-REFERENCE TO RELATED APPLICATION

This application is based upon and claims the benefit of priority from Japanese Patent Application No. 2022-071288, filed on Apr. 25, 2022, the entire contents of which are incorporated herein by reference.

FIELD

Embodiments described herein relate generally to a film forming apparatus and a film forming method.

BACKGROUND

As a method for forming a film on a substrate, there is an atomic layer deposition method. In the ALD method, assuming that the supply of source gas and the exhaust of residual gas is one cycle, a film is formed by repeating the cycle. By shortening the time required for one cycle, the film formation time can be shortened.

BRIEF DESCRIPTION OF THE DRAWINGS

FIG. 14 is an explanatory diagram of the function and effect of a film forming apparatus and the film forming method according to the second embodiment;

FIG. 15 is an explanatory diagram of the function and effect of the film forming apparatus and the film forming method according to the second embodiment;

FIG. 17 is an explanatory diagram of the film forming method according to the second embodiment;

FIG. 31 is an explanatory diagram of the function and effect of a film forming apparatus and the film forming method according to the fourth embodiment;

FIG. 32 is an explanatory diagram of the function and effect of the film forming apparatus and the film forming method according to the fourth embodiment;

FIG. 34 is an explanatory diagram of the film forming method according to the fourth embodiment.

DETAILED DESCRIPTION

Figure 1:
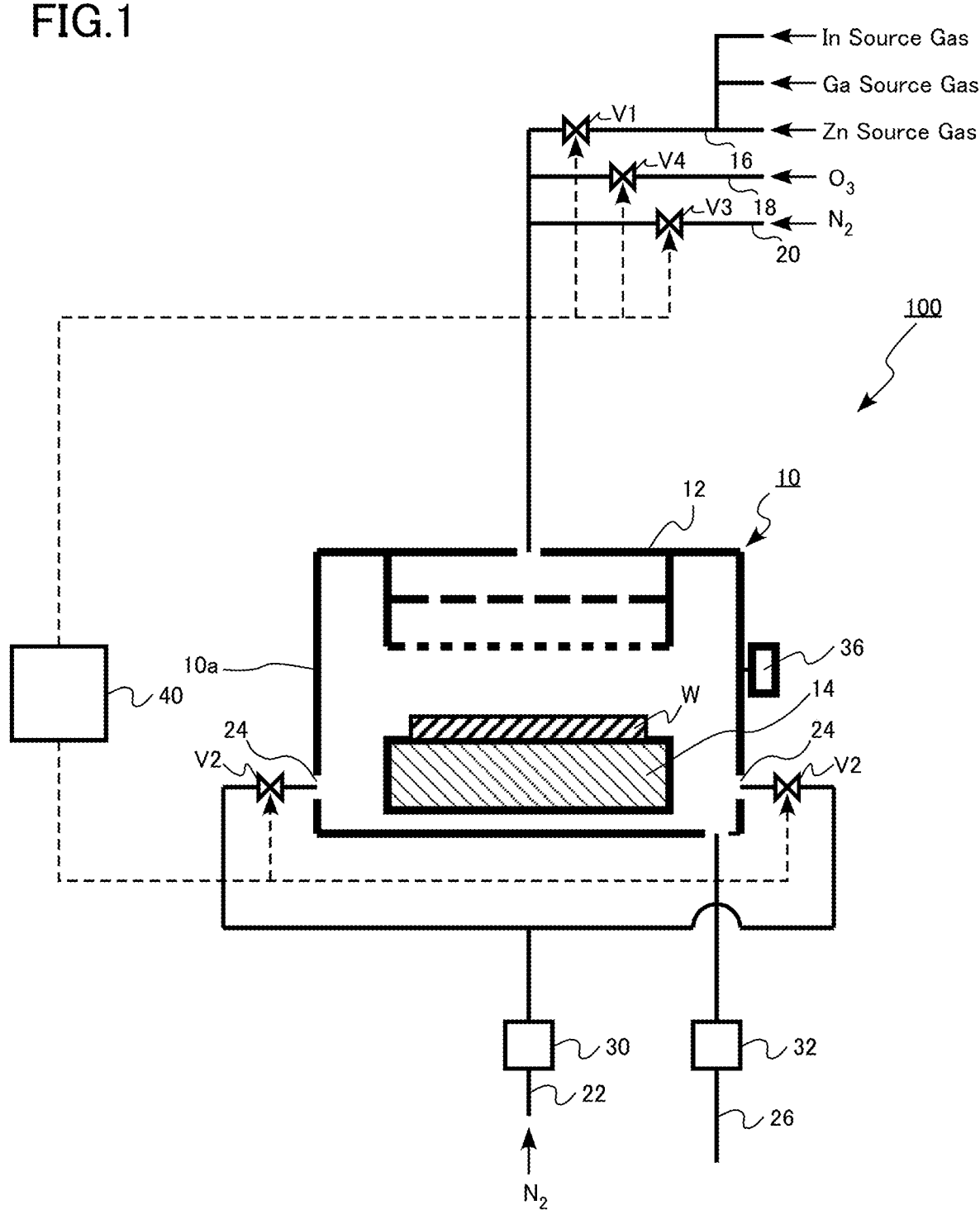
FIG. 1 is a schematic diagram of a film forming apparatus according to a first embodiment.

A film forming apparatus of embodiments includes: a chamber including a sidewall; a shower head provided in an upper part of the chamber; a holder provided in the chamber holding a substrate; a first gas supply pipe supplying a first gas to the shower head; a first valve provided in the first gas supply pipe; at least one gas supply portion provided in a region of the chamber other than the shower head; a second gas supply pipe supplying a second gas to the at least one gas supply portion; a second valve provided in the second gas supply pipe; a gas exhaust pipe exhausting a gas from the chamber; and an exhaust device connected to the gas exhaust pipe.

Hereinafter, embodiments will be described with reference to the diagrams. In the following description, the same or similar members and the like may be denoted by the same reference numerals, and the description of the members and the like once described may be omitted as appropriate.

Hereinafter, a film forming apparatus and a film forming method according to embodiments will be described with reference to the diagrams.

First Embodiment

A film forming apparatus according to a first embodiment includes: a chamber including a sidewall; a shower head provided in an upper part of the chamber; a holder provided in the chamber holding a substrate; a first gas supply pipe supplying a first gas to the shower head; a first valve provided in the first gas supply pipe; at least one gas supply portion provided in a region of the chamber other than the shower head; a second gas supply pipe supplying a second gas to the at least one gas supply portion; a second valve provided in the second gas supply pipe; a gas exhaust pipe exhausting a gas from the chamber; and an exhaust device connected to the gas exhaust pipe.

FIG. 1 is a schematic diagram of the film forming apparatus according to the first embodiment. The film forming apparatus according to the first embodiment is a film forming apparatus 100 that forms a film using atomic layer deposition (ALD). The film forming apparatus 100 is a single wafer type film forming apparatus that forms a film on one substrate in one film forming process.

The film forming apparatus 100 includes, for example, a chamber 10, a shower head 12, a holder 14, a first source gas supply pipe 16, a second source gas supply pipe 18, a purge gas supply pipe 20, a pressure control gas supply pipe 22, a pressure control gas supply hole 24, a gas exhaust pipe 26, a regulator 30, an exhaust device 32, a pressure gauge 36, and a control unit 40. The chamber 10 includes a sidewall 10a. In addition, the film forming apparatus 100 includes a first valve V1, a second valve V2, a third valve V3, and a fourth valve V4.

The first source gas supply pipe 16 is an example of the first gas supply pipe. The pressure control gas supply pipe 22 is an example of the second gas supply pipe. The pressure control gas supply hole 24 is an example of a gas supply portion.

Film formation is performed inside the chamber 10. The chamber 10 includes the sidewall 10a. The sidewall 10a surrounds the shower head 12 and the holder 14, for example.

The shower head 12 is provided in the upper part of the chamber 10. The shower head 12 supplies a gas supplied from the first source gas supply pipe 16, the second source gas supply pipe 18, and the purge gas supply pipe 20 into the chamber 10 in the form of a shower.

The holder 14 is provided in the chamber 10. For example, a semiconductor wafer W is placed on the holder 14. The semiconductor wafer W is an example of a substrate.

For example, a heater (not shown) is provided inside the holder 14. It is possible to heat the semiconductor wafer W by the heater.

The first source gas supply pipe 16 is connected to the shower head 12. The first source gas supply pipe 16 supplies a first source gas to the shower head 12. The first source gas is an example of the first gas. The first source gas contains, for example, a metal element.

The first source gas is, for example, a gas containing indium (In). The first source gas is, for example, trimethylindium.

The first source gas is, for example, a gas containing gallium (Ga). The first source gas is, for example, trimethylgallium.

The first source gas is, for example, a gas containing zinc (Zn). The first source gas is, for example, dimethylzinc.

For example, as the first source gas, one of the gas containing indium (In), the gas containing gallium (Ga), and the gas containing zinc (Zn) can be selected by controlling an on-off valve (not shown).

The first valve V1 is provided in the first source gas supply pipe 16. The start and stop of the supply of the first source gas to the shower head 12 are controlled by opening and closing the first valve V1.

The second source gas supply pipe 18 is connected to the shower head 12. The second source gas supply pipe 18 supplies a second source gas to the shower head 12. The second source gas is an example of the first gas.

The second source gas is, for example, a gas containing oxygen (O). The second source gas is, for example, an ozone gas.

The fourth valve V4 is provided in the second source gas supply pipe 18. The start and stop of the supply of the second source gas to the shower head 12 are controlled by opening and closing the fourth valve V4.

The purge gas supply pipe 20 is connected to the shower head 12. The purge gas supply pipe 20 supplies a purge gas to the shower head 12.

The purge gas contains, for example, an inert gas. The purge gas is, for example, a nitrogen gas, an argon gas, a xenon gas, or a neon gas.

The third valve V3 is provided in the purge gas supply pipe 20. The start and stop of the supply of the purge gas to the shower head 12 are controlled by opening and closing the third valve V3.

The pressure control gas supply hole 24 is provided in a region of the chamber 10 other than the shower head 12. The pressure control gas supply hole 24 is provided, for example, in the sidewall 10a. The pressure control gas supply hole 24 is provided below the upper surface of the holder 14, for example.

The pressure control gas supply hole 24 is connected to the pressure control gas supply pipe 22. The pressure control gas supply hole 24 supplies the pressure control gas supplied from the pressure control gas supply pipe 22 into the chamber 10.

The pressure control gas supply pipe 22 is connected to the pressure control gas supply hole 24. The pressure control gas supply pipe 22 supplies the pressure control gas to the pressure control gas supply hole 24.

The pressure control gas contains, for example, an inert gas. The pressure control gas is, for example, a nitrogen gas, an argon gas, a xenon gas, or a neon gas.

The second valve V2 is provided in the pressure control gas supply pipe 22. The start and stop of the supply of the pressure control gas to the pressure control gas supply hole 24 are controlled by opening and closing the second valve V2.

The second valve V2 is a high speed valve. The second valve is, for example, a valve whose opening/closing speed is equal to or more than 1 msec and equal to or less than 100 msec. The second valve V2 has only one degree of opening, for example. The second valve V2 is, for example, a valve that performs only opening and closing operations.

Figure 2:
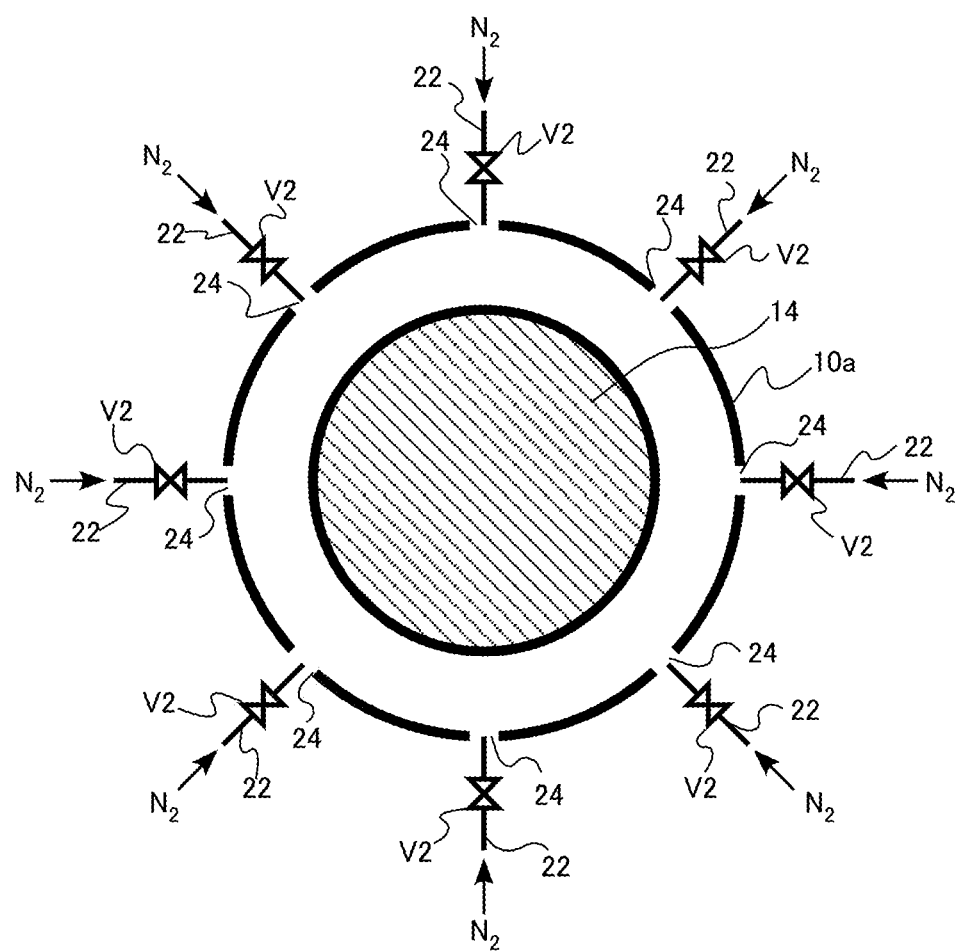
FIG. 2 is a schematic diagram of the film forming apparatus according to the first embodiment.

FIG. 2 is a schematic diagram of the film forming apparatus according to the first embodiment. FIG. 2 is a cross-sectional view including the holder 14 and the pressure control gas supply hole 24.

As shown in FIG. 2, a plurality of pressure control gas supply holes 24 are provided in the sidewall of the chamber 10. The plurality of pressure control gas supply holes 24 are arranged, for example, on the circumference along the sidewall 10a. For example, the plurality of pressure control gas supply holes 24 are evenly spaced on the circumference along the sidewall 10a. The plurality of pressure control gas supply holes 24 are arranged, for example, on the circumference surrounding the holder 14. For example, the plurality of pressure control gas supply holes 24 are evenly spaced on the circumference surrounding the holder 14.

The regulator 30 is provided in the pressure control gas supply pipe 22. The second valve V2 is provided between the regulator 30 and the pressure control gas supply hole 24.

The regulator 30 has a function of controlling the pressure of the pressure control gas before the second valve V2 opens to be a predetermined pressure. The regulator 30 is fixed to have a predetermined degree of opening during the formation of a film on the semiconductor wafer W, for example.

The gas exhaust pipe 26 is provided below the chamber 10, for example. The residual gas in the chamber 10 is exhausted out of the chamber 10 through the gas exhaust pipe 26. For example, the unconsumed first source gas, the unconsumed second source gas, a buffer gas, or reaction products are exhausted out of the chamber 10 through the gas exhaust pipe 26.

The exhaust device 32 is connected to the gas exhaust pipe 26. The exhaust device 32 is, for example, a vacuum pump.

The pressure gauge 36 has a function of measuring the pressure in the chamber 10.

The control unit 40 has a function of controlling the film forming operation of the film forming apparatus 100. For example, the control unit 40 controls opening and closing of the first valve V1. For example, the control unit 40 controls opening and closing of the second valve V2. For example, the control unit 40 controls opening and closing of the third valve V3. For example, the control unit 40 controls opening and closing of the fourth valve V4.

The control unit 40 is, for example, a control circuit. The control unit 40 is, for example, an electronic circuit. The control unit 40 includes, for example, hardware and software.

The control unit 40 includes, for example, a central processing unit (CPU). The control unit 40 includes, for example, a storage device. The storage device included in the control unit 40 is, for example, a semiconductor memory, a solid state device (SSD), or a hard disk.

Next, a film forming method according to the first embodiment will be described. The film forming method according to the first embodiment is a film forming method using a film forming apparatus including: a chamber including a sidewall; a shower head provided in an upper part of the chamber; a holder provided in the chamber holding a substrate; a first gas supply pipe supplying a first gas to the shower head; a first valve provided in the first gas supply pipe; a gas supply portion provided in a region of the chamber other than the shower head; a second gas supply pipe supplying a second gas to the gas supply portion; a second valve provided in the second gas supply pipe; a gas exhaust pipe exhausting a gas from the chamber; and an exhaust device connected to the gas exhaust pipe. The film forming method includes: loading a substrate into the chamber; placing the substrate on the holder; driving the exhaust device to reduce a pressure in the chamber; opening the second valve to supply the second gas containing an inert gas from the second gas supply pipe into the chamber through the gas supply portion; opening the first valve to supply the first gas containing a metal element into the chamber through the shower head; closing the second valve; closing the first valve; and reducing the pressure in the chamber.

In the film forming method according to the first embodiment, a film containing a metal element is formed on the semiconductor wafer W by ALD using the film forming apparatus 100 according to the first embodiment. Hereinafter, a case of forming an oxide film containing indium (In), gallium (Ga), and zinc (Zn), that is, an indium gallium zinc oxide film will be described as an example.

Figure 3:
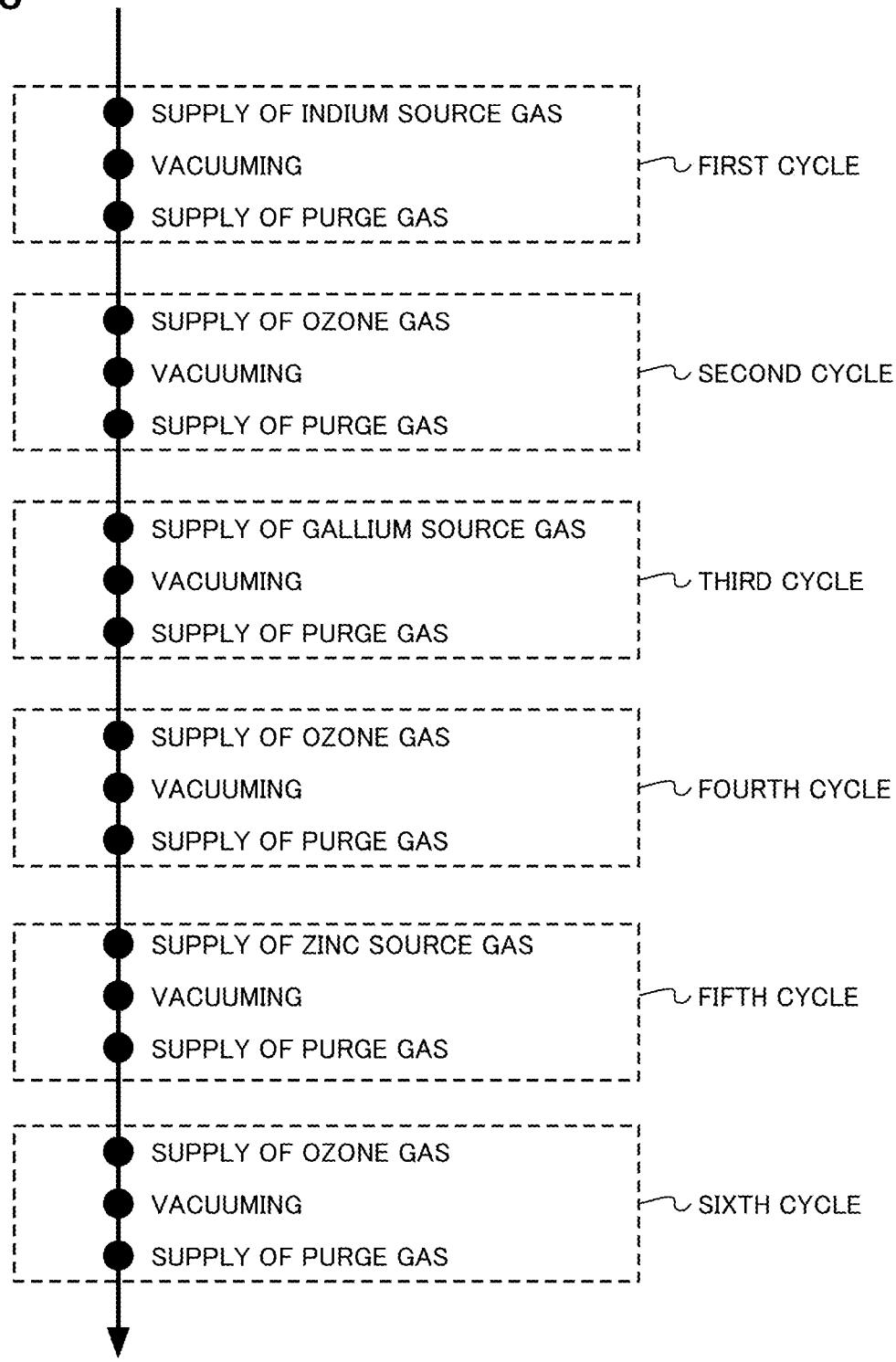
FIG. 3 is an explanatory diagram of a film forming method according to the first embodiment.

FIG. 3 is an explanatory diagram of the film forming method according to the first embodiment. FIG. 3 is a diagram showing a part of a process sequence when forming an indium gallium zinc oxide film by ALD.

As shown in FIG. 3, when forming an indium gallium zinc oxide film by ALD, for example, an atomic layer of indium is formed in the first cycle and an atomic layer of oxygen is formed in the second cycle, thereby forming a molecular layer of indium oxide. Then, an atomic layer of gallium is formed in the third cycle and an atomic layer of oxygen is formed in the fourth cycle, thereby forming a molecular layer of gallium oxide. Then, an atomic layer of zinc is formed in the fifth cycle and an atomic layer of oxygen is formed in the sixth cycle, thereby forming a molecular layer of zinc oxide.

In all of the cycles, the supply of a source gas, vacuuming, and the supply of a purge gas are performed. By performing vacuuming and supplying the purge gas, a source gas remaining in the chamber is exhausted to the outside of the chamber.

By repeating the first cycle to the sixth cycle a predetermined number of times, an indium gallium zinc oxide film having a desired thickness is formed.

FIGS. 4 to 9 are explanatory diagrams of the film forming method according to the first embodiment. FIGS. 4 to 9 are diagrams showing the operation of the film forming apparatus 100. FIGS. 4 to 9 are explanatory diagrams of the first cycle in FIG. 3.

Figure 4:
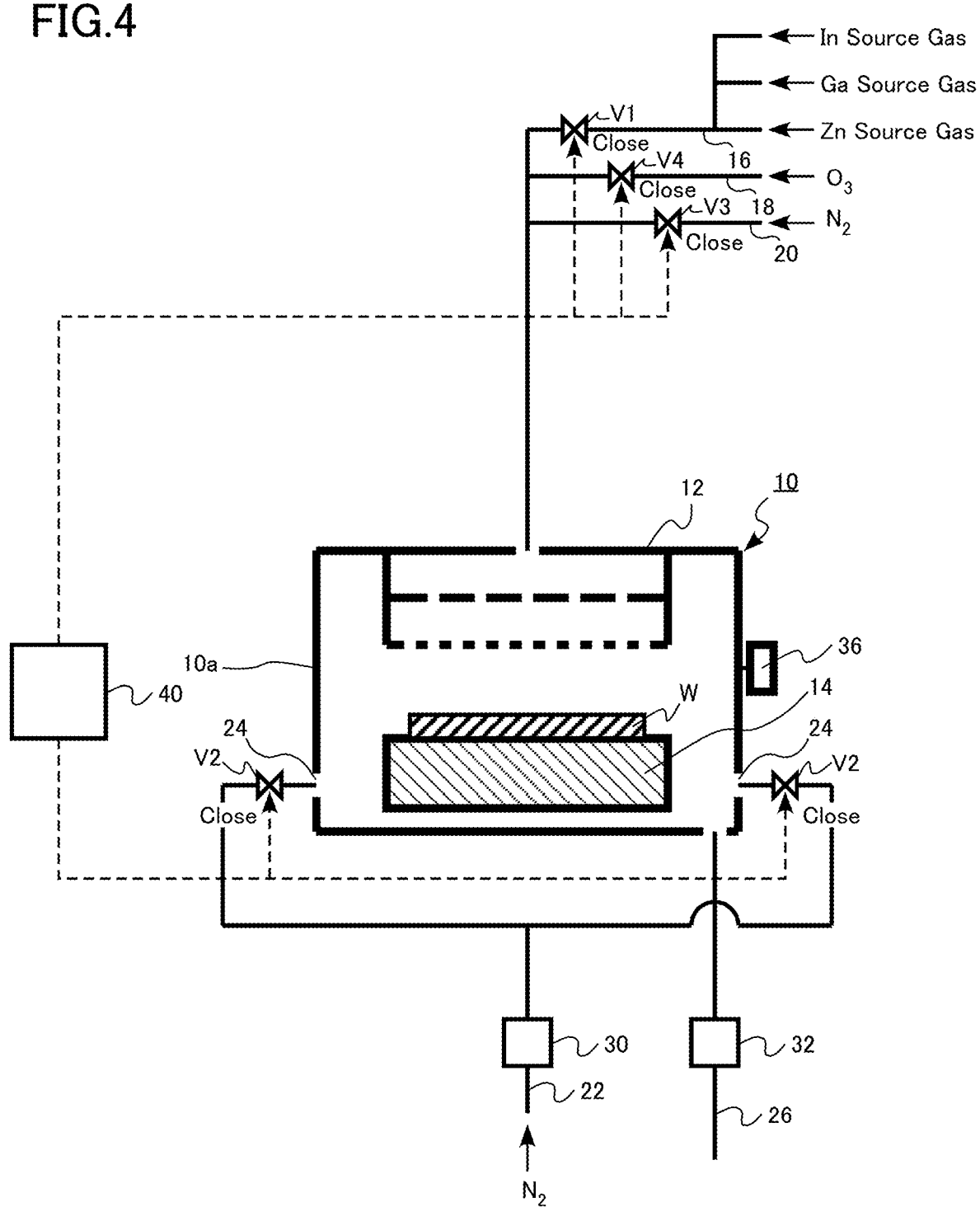
FIG. 4 is an explanatory diagram of the film forming method according to the first embodiment.

First, the semiconductor wafer W is loaded into the chamber 10. Then, the loaded semiconductor wafer W is placed on the holder 14 (FIG. 4).

Figure 5:
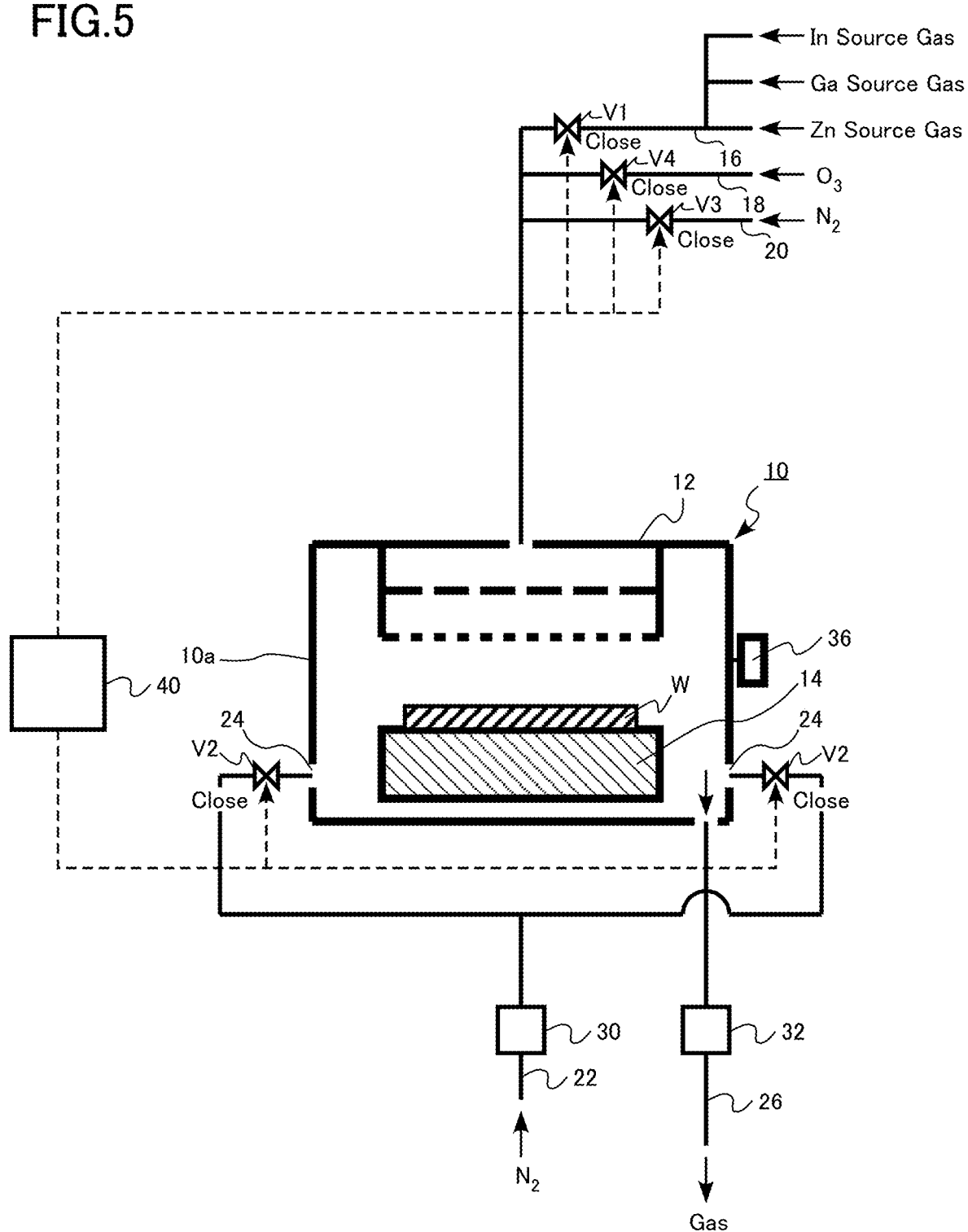
FIG. 5 is an explanatory diagram of the film forming method according to the first embodiment.

Then, the exhaust device 32 is driven to reduce the pressure in the chamber 10 to a predetermined pressure (FIG. 5). At this time, the semiconductor wafer W is heated by, for example, a heater (not shown).

Figure 6:
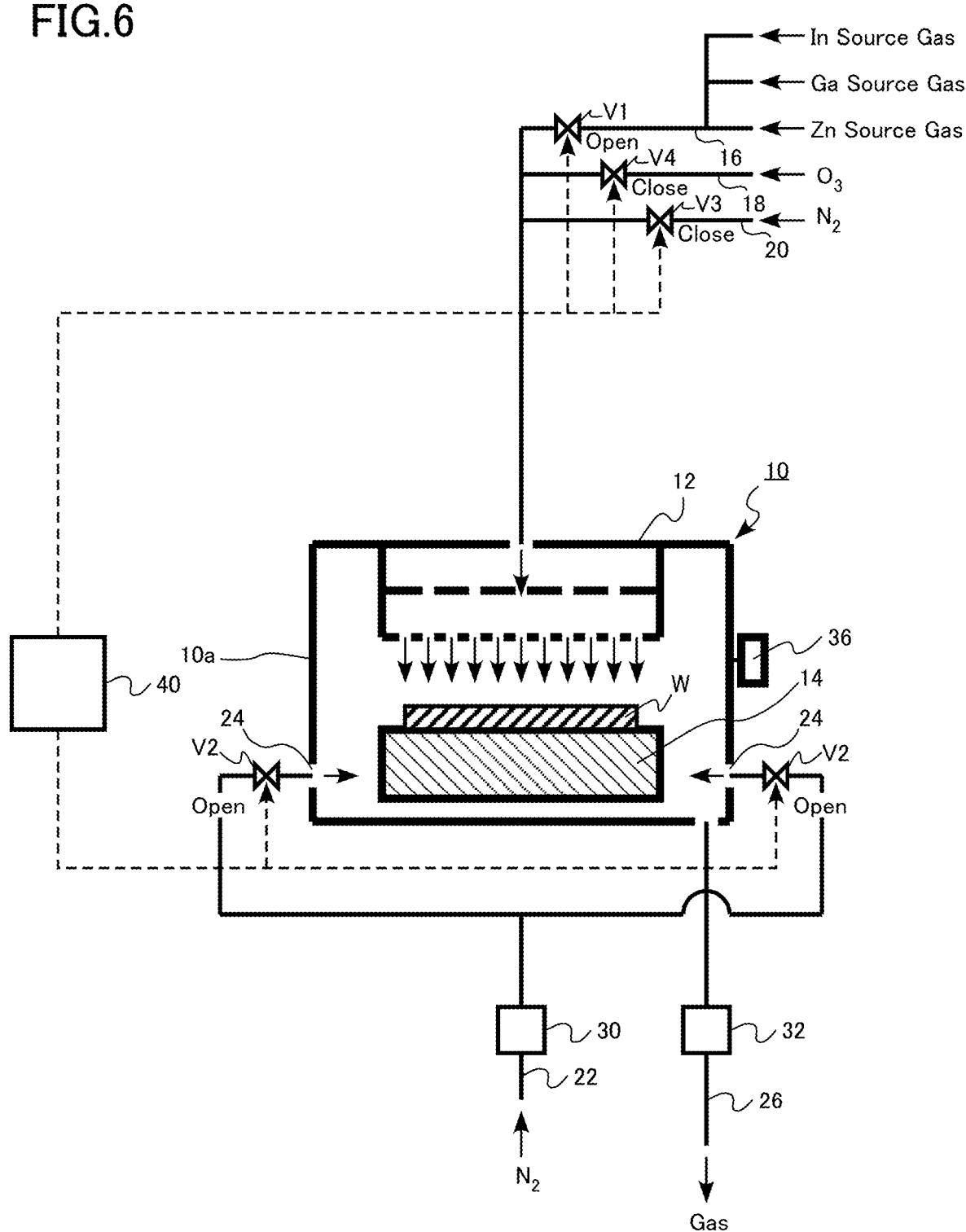
FIG. 6 is an explanatory diagram of the film forming method according to the first embodiment.

Then, the second valve V2 provided in the pressure control gas supply pipe 22 is opened. By opening the second valve V2, a nitrogen gas, which is an example of the pressure control gas, is supplied from the pressure control gas supply pipe 22 into the chamber 10 through the pressure control gas supply hole 24 (FIG. 6). By supplying the nitrogen gas into the chamber 10, the exhaust of gas from the chamber 10 is suppressed to increase the pressure in the chamber 10.

The pressure control gas supply pipe 22 is an example of the second gas supply pipe. The nitrogen gas is an example of the second gas.

At the same time as opening the second valve V2, the first valve V1 provided in the first source gas supply pipe 16 is opened. By opening the first valve V1, an indium source gas is supplied into the chamber 10 through the shower head 12 (FIG. 6). Indium of the source gas is adsorbed on the surface of the semiconductor wafer W, so that an atomic layer of indium is formed. In addition, the timing of opening the second valve V2 and the timing of opening the first valve V1 may not completely match each other. The timing of opening the second valve V2 and the timing of opening the first valve V1 may be different.

Figure 7:
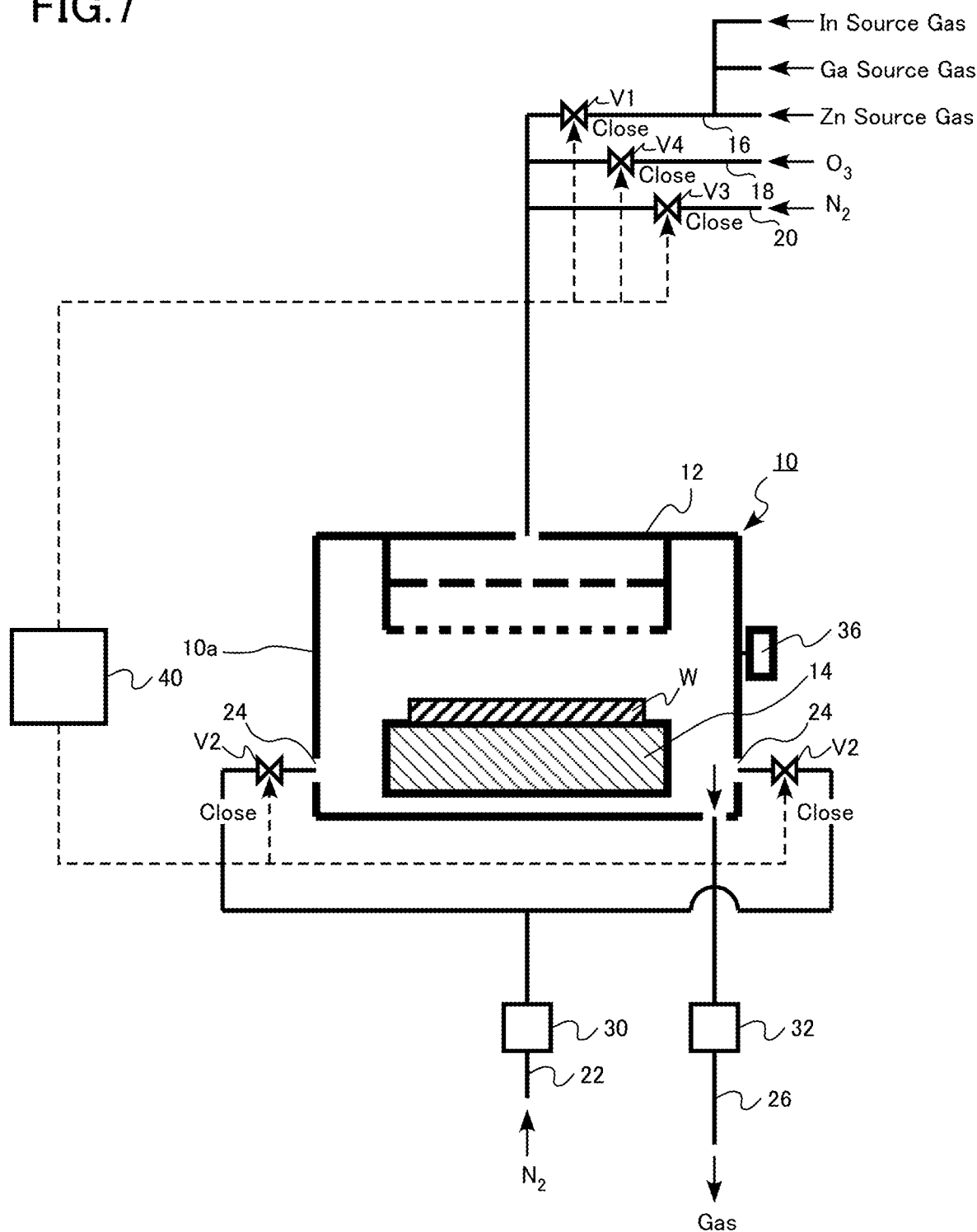
FIG. 7 is an explanatory diagram of the film forming method according to the first embodiment.

After a predetermined time passes and an atomic layer of indium is formed on the semiconductor wafer W, the second valve V2 provided in the pressure control gas supply pipe 22 is closed. By closing the second valve V2, the supply of the nitrogen gas into the chamber 10 is stopped (FIG. 7). By stopping the supply of the nitrogen gas into the chamber 10, the exhaust of gas from the chamber 10 is promoted to reduce the pressure in the chamber 10.

At the same time as closing the second valve V2, the first valve V1 provided in the first source gas supply pipe 16 is closed. By closing the first valve V1, the supply of the indium source gas into the chamber 10 is stopped (FIG. 7). In addition, the timing of closing the second valve V2 and the timing of closing the first valve V1 may not completely match each other. The timing of closing the second valve V2 and the timing of closing the first valve V1 may be different.

The supply of the nitrogen gas and the indium source gas into the chamber 10 is stopped to vacuum the chamber 10.

Figure 8:
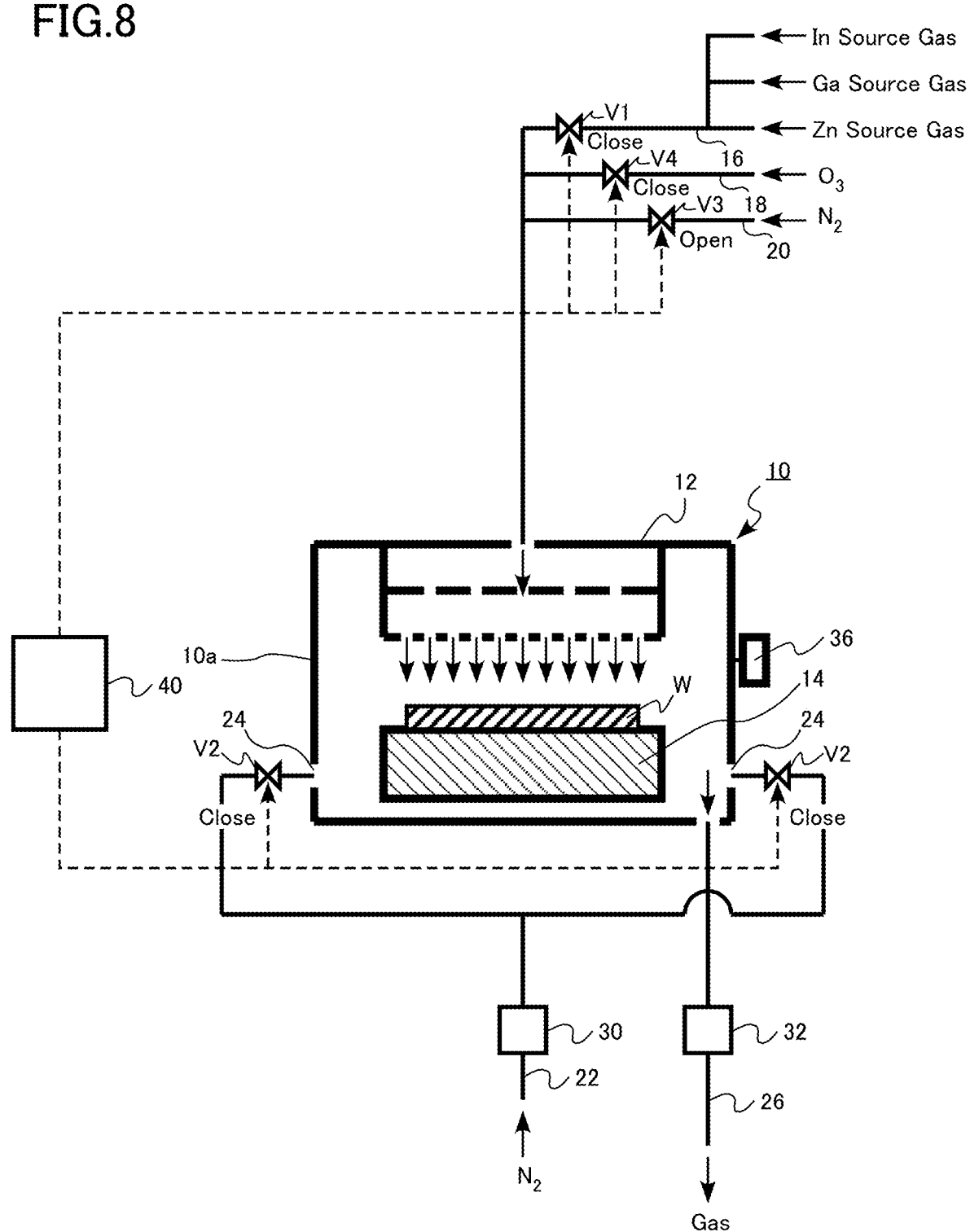
FIG. 8 is an explanatory diagram of the film forming method according to the first embodiment.

Then, the third valve V3 provided in the purge gas supply pipe 20 is opened. By opening the third valve V3, a nitrogen gas, which is an example of the purge gas, is supplied into the chamber 10 through the shower head 12 (FIG. 8).

Figure 9:
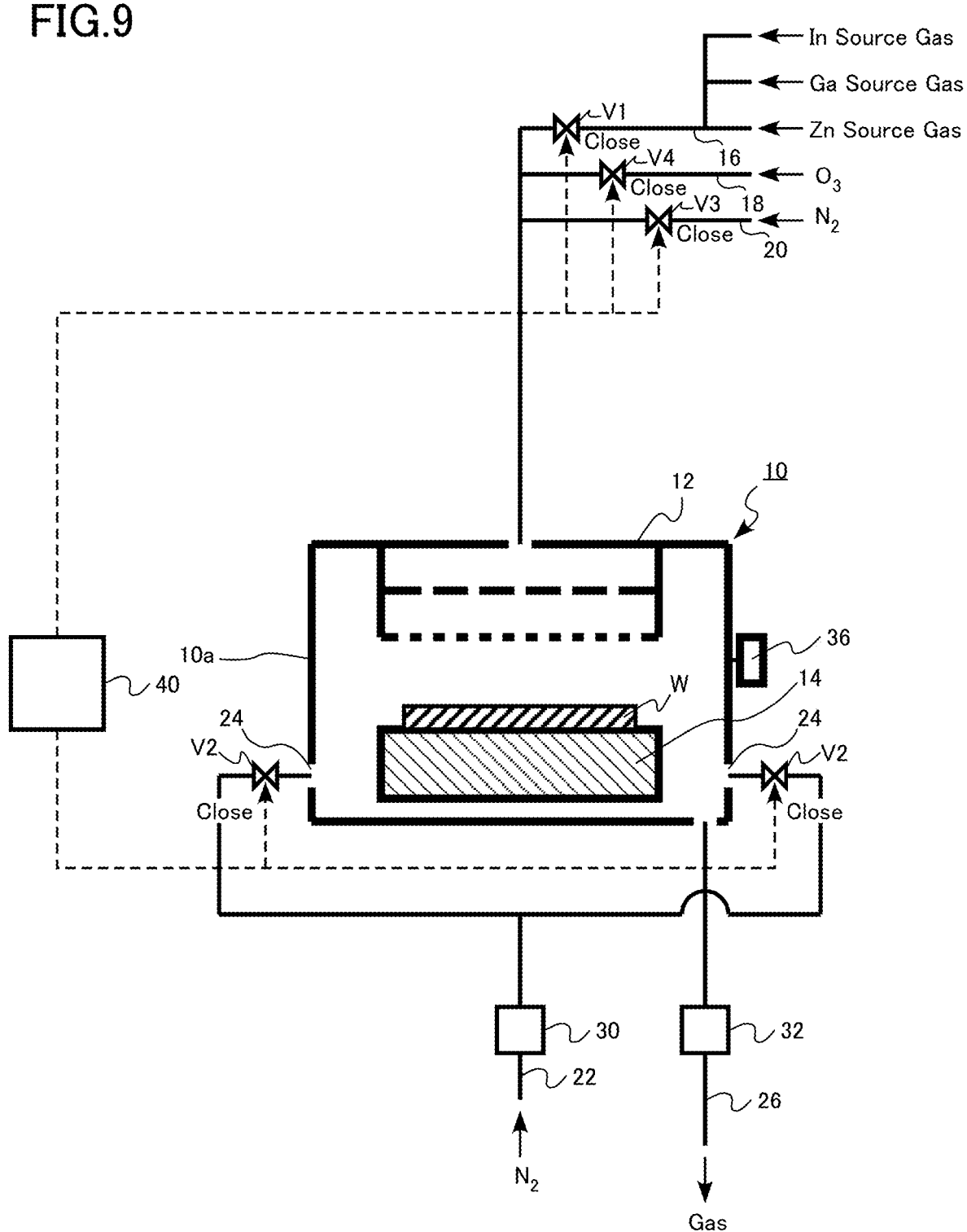
FIG. 9 is an explanatory diagram of the film forming method according to the first embodiment.

Then, the third valve V3 provided in the purge gas supply pipe 20 is closed (FIG. 9). The supply of the nitrogen gas into the chamber 10 is stopped, and the purging process for the chamber 10 ends.

As described above, the first cycle shown in FIG. 3 ends. Thereafter, the source gas is changed, and the second cycle, third cycle, fourth cycle, fifth cycle, and sixth cycle are performed in the same manner as the first cycle.

Next, the function and effect of the film forming apparatus and the film forming method according to the first embodiment will be described.

In film deposition using ALD, many cycles are repeated. Therefore, in order to shorten the film formation time and improve productivity, it is desirable to shorten the time required for one cycle. In particular, in a single wafer type film forming apparatus that forms a film on one substrate in one film forming process, it is desirable to shorten the time required for one cycle. Hereinafter, the time required for one cycle is referred to as a cycle time.

By increasing the pressure in the chamber when supplying the source gas, the efficiency of adsorption of the raw material on the substrate surface increases. Therefore, since the atomic layer can be formed in a short time, it is possible to shorten the cycle time.

On the other hand, if the pressure in the chamber when supplying the source gas is increased, it takes time to increase and decrease the pressure, resulting in a longer cycle time. Therefore, it is desired to reduce the time required to increase and decrease the pressure.

Figure 10:
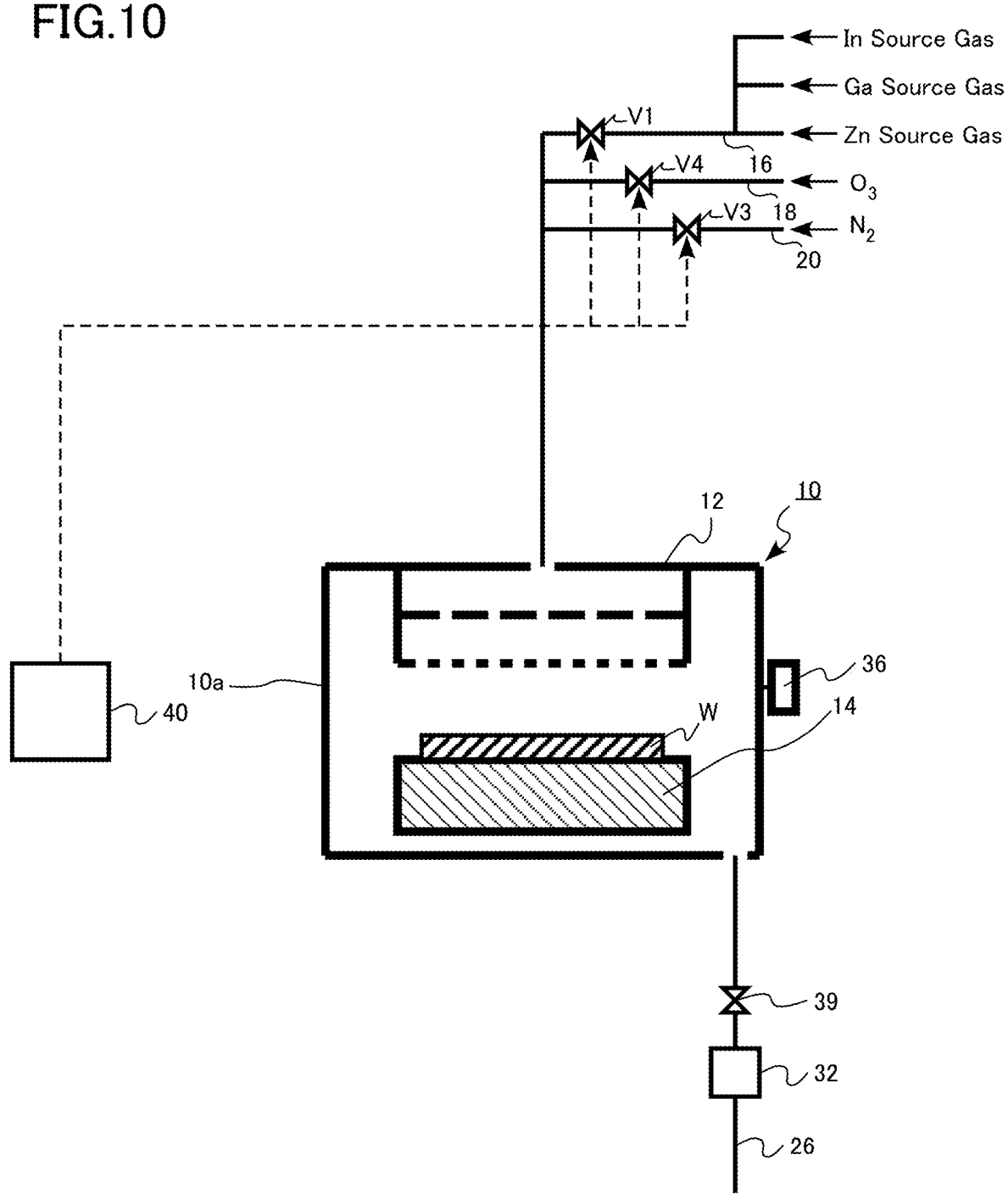
FIG. 10 is a schematic diagram of a film forming apparatus of a comparative example.

FIG. 10 is a schematic diagram of a film forming apparatus of a comparative example. The film forming apparatus of the comparative example is a film forming apparatus 900 that deposits a film using ALD. The film forming apparatus 900 is a single wafer type film forming apparatus that forms a film on one substrate in one film forming process.

The film forming apparatus 900 of the comparative example is different from the film forming apparatus 100 according to the first embodiment in that the pressure control gas supply pipe 22, the pressure control gas supply hole 24, and the regulator 30 are not provided. In addition, the film forming apparatus 900 of the comparative example is different from the film forming apparatus 100 according to the first embodiment in that a pressure control valve 39 is provided.

The pressure control valve 39 is provided in the gas exhaust pipe 26. The film forming apparatus 900 of the comparative example adjusts the pressure in the chamber 10 by adjusting the degree of opening of the pressure control valve 39.

A case is considered in which the same process as in the first cycle shown in FIG. 3 is performed by using the film forming apparatus 900 of the comparative example.

When forming an atomic layer of indium on the semiconductor wafer W, in the film forming apparatus 900 of the comparative example, the degree of opening of the pressure control valve 39 is reduced to suppress the exhaust of gas and increase the pressure in the chamber 10. In addition, when performing vacuuming after the atomic layer of indium is formed, the degree of opening of the pressure control valve 39 is increased to promote the exhaust of gas and reduce the pressure in the chamber 10.

It takes time to change the degree of opening of the pressure control valve 39. For this reason, even if the cycle time is shortened by increasing the pressure in the chamber, the time required to increase and decrease the pressure increases, making it difficult to shorten the cycle time.

The film forming apparatus 100 according to the first embodiment controls the pressure in the chamber 10 by controlling the supply of the nitrogen gas from the pressure control gas supply hole 24 into the chamber 10. The supply of the nitrogen gas into the chamber 10 are controlled by the second valve V2 that operates at high speed since the second valve V2 has only a function of controlling opening and closing. As a result, the time required to increase and decrease the pressure in the chamber 10 is reduced.

Therefore, even in a case where the cycle time is shortened by increasing the pressure in the chamber, the cycle time can be shortened by shortening the time required to increase and decrease the pressure in the chamber 10. As a result, since one cycle time is shortened, the film formation time of the indium gallium zinc oxide film can be shortened, and the productivity of the indium gallium zinc oxide film is improved.

From the viewpoint of preventing the flow of the pressure control gas supplied from the pressure control gas supply hole 24 into the chamber 10 from affecting the in-wafer uniformity of the formed film, it is preferable that a plurality of pressure control gas supply holes 24 are arranged on the circumference along the sidewall 10a. It is preferable that the plurality of pressure control gas supply holes 24 are evenly spaced on the circumference along the sidewall 10a. It is preferable that the plurality of pressure control gas supply holes 24 are evenly spaced on the circumference surrounding the holder 14.

In addition, from the viewpoint of preventing the flow of the pressure control gas supplied from the pressure control gas supply hole 24 into the chamber 10 from affecting the in-wafer uniformity of the formed film, it is preferable that the pressure control gas supply hole 24 is provided below the upper surface of the holder 14.

From the viewpoint of shortening the time required to increase and decrease the pressure, the opening/closing speed of the second valve is preferably equal to or less than 100 msec, more preferably equal to or less than 10 msec.

Modification Example

A film forming apparatus according to a modification example of the first embodiment is different from the film forming apparatus according to the first embodiment in that the chamber includes a partition wall surrounding the holder and having an opening and the gas supply portion is provided between the partition wall and the sidewall.

Figure 11:
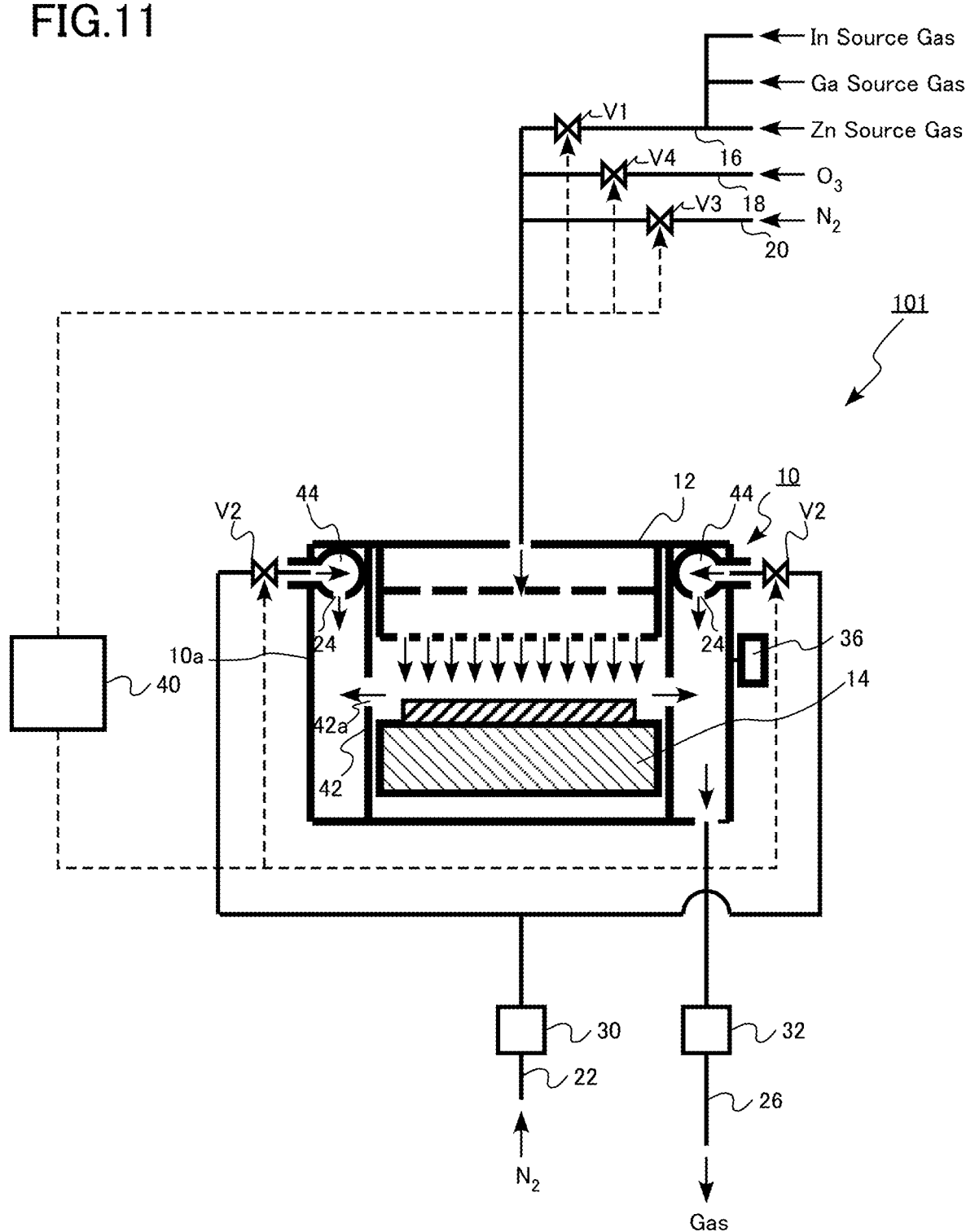
FIG. 11 is a schematic diagram of a film forming apparatus according to a modification example of the first embodiment.
Figure 12:
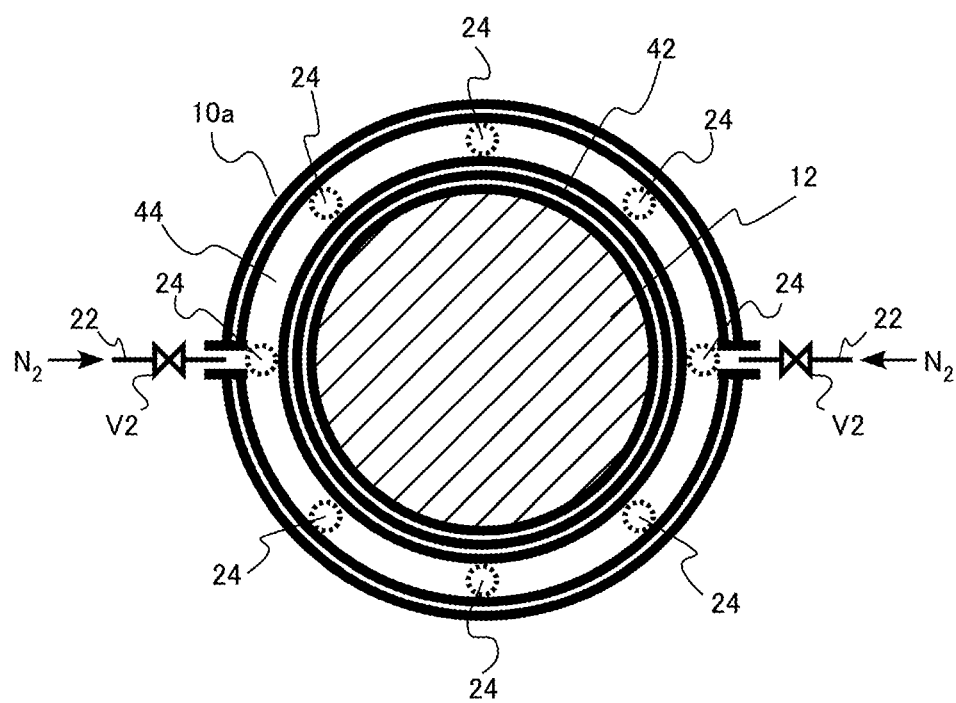
FIG. 12 is a schematic diagram of a film forming apparatus according to a modification example of the first embodiment.

FIGS. 11 and 12 are schematic diagrams of the film forming apparatus according to the modification example of the first embodiment. The film forming apparatus according to the modification example is a film forming apparatus 101 that forms a film using ALD.

The film forming apparatus 101 includes a partition wall 42. In addition, the film forming apparatus 101 includes a control gas flow path 44. FIG. 12 is a cross-sectional view including the shower head 12 and the control gas flow path 44.

The partition wall 42 is provided between the holder 14 and the sidewall 10a in the chamber 10. An opening 42a is provided in the partition wall 42. Gas is exhausted to the gas exhaust pipe 26 through the opening 42a. By providing the partition wall 42, for example, the exhaust of the gas in the circumferential direction of the semiconductor wafer W becomes uniform.

The control gas flow path 44 is provided between the partition wall 42 and the sidewall 10a. The control gas flow path 44 is provided around the shower head 12. The control gas flow path 44 has an annular shape.

A plurality of pressure control gas supply holes 24 are provided below the control gas flow path 44. The plurality of pressure control gas supply holes 24 are arranged, for example, on the circumference along the sidewall 10a. For example, the plurality of pressure control gas supply holes 24 are evenly spaced on the circumference along the sidewall 10a.

The control gas supplied from the exhaust control gas supply pipe 23 to the control gas flow path 44 is supplied from the plurality of pressure control gas supply holes 24 to between the partition wall 42 and the sidewall 10a.

As described above, according to the film forming apparatus and the film forming method according to the first embodiment and the modification example, it is possible to shorten the film formation time.

Second Embodiment

A film forming apparatus according to a second embodiment is different from the film forming apparatus according to the first embodiment in that the control circuit performs control to open the first valve after a first time passes from the opening of the second valve and the control circuit performs control to close the first valve after a second time passes from the closing of the second valve. Hereinafter, the description of a part of the content overlapping the first embodiment may be omitted.

The film forming apparatus according to the second embodiment has the same configuration as the film forming apparatus 100 according to the first embodiment except for the configuration of the control unit 40. Hereinafter, the configuration of the film forming apparatus according to the second embodiment will be described with reference to FIG. 1 of the first embodiment.

The control unit 40 of the film forming apparatus according to the second embodiment performs control to open the first valve V1 provided in the first source gas supply pipe 16 after the first time passes from the opening of the second valve V2 provided in the pressure control gas supply pipe 22. In addition, the control unit 40 of the film forming apparatus according to the second embodiment performs control to close the first valve V1 provided in the first source gas supply pipe 16 after the second time passes from the closing of the second valve V2 provided in the pressure control gas supply pipe 22.

Figure 13:
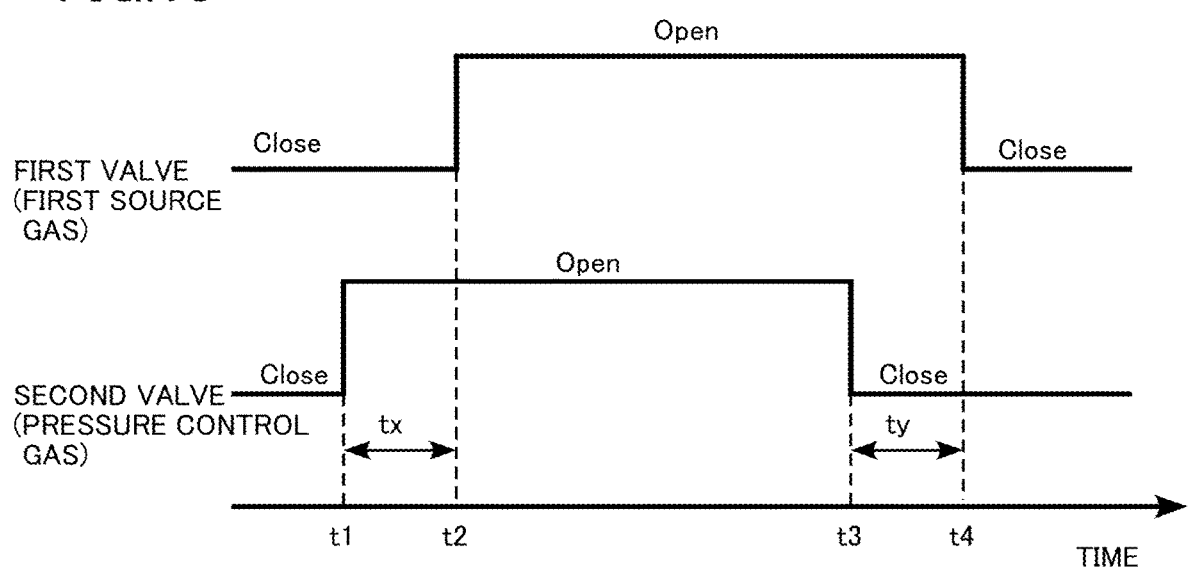
FIG. 13 is an explanatory diagram of a film forming method according to a second embodiment.

FIG. 13 is an explanatory diagram of a film forming method according to the second embodiment. FIG. 13 is a diagram showing the opening/closing timing of the first valve and the opening/closing timing of the second valve.

For example, when forming a film by supplying the first source gas from the first source gas supply pipe 16 into the chamber 10, as shown in FIG. 13, the first valve V1 provided in the first source gas supply pipe 16 is opened at time t2 after a first time (tx in FIG. 13) passes from the opening of the second valve V2 provided in the pressure control gas supply pipe 22 at time t1. In addition, as shown in FIG. 13, the first valve V1 provided in the first source gas supply pipe 16 is closed at time t4 after a second time (ty in FIG. 13) passes from the closing of the second valve V2 provided in the pressure control gas supply pipe 22 at time t3.

FIG. 14 is an explanatory diagram of the function and effect of the film forming apparatus and the film forming method according to the second embodiment. The upper diagram in FIG. 14 is a diagram showing the opening/closing timing of the first valve and the opening/closing timing of the second valve in the film forming method of a comparative example. The lower diagram in FIG. 14 shows a change in chamber pressure over time in the film forming method of the comparative example.

In the film forming method of the comparative example, when forming a film by supplying the first source gas from the first source gas supply pipe 16 into the chamber 10, as shown in the upper diagram in FIG. 14, the second valve V2 provided in the pressure control gas supply pipe 22 is opened at time t1', and at the same time, the first valve V1 provided in the first source gas supply pipe 16 is opened. In addition, as shown in the upper diagram in FIG. 14, the second valve V2 provided in the pressure control gas supply pipe 22 is closed at time t2', and at the same time, the first valve V1 provided in the first source gas supply pipe 16 is closed.

As shown in the lower diagram in FIG. 14, when the first valve V1 and the second valve V2 are opened at the same time, a delay of the first time tx occurs before the chamber pressure increases from the first pressure P1 to the desired second pressure P2. In other words, the responsiveness of the chamber pressure to the operation of the first valve V1 and the second valve V2 when increasing the chamber pressure is poor.

In addition, as shown in FIG. 14, when the first valve V1 and the second valve V2 are closed at the same time, a delay of the second time ty occurs before the chamber pressure decreases from the second pressure P2 to the desired first pressure P1. In other words, the responsiveness of the chamber pressure to the operation of the first valve V1 and the second valve V2 when decreasing the chamber pressure is poor.

If the responsiveness of the chamber pressure to the operation of the first valve V1 and the second valve V2 is poor, for example, the timing of starting and stopping the supply of the source gas deviates from the actual timing of film formation or vacuuming. As a result, it becomes difficult to control the film forming process. In addition, for example, there is a possibility that the cycle time becomes long and accordingly the film formation time becomes long.

FIG. 15 is an explanatory diagram of the function and effect of the film forming apparatus and the film forming method according to the second embodiment. The upper diagram in FIG. 15 is a diagram showing the opening/closing timing of the first valve and the opening/closing timing of the second valve in the film forming method according to the second embodiment. The lower diagram in FIG. 15 shows a change in chamber pressure over time in the film forming method according to the second embodiment.

As shown in FIG. 15, the second valve V2 is opened at time t1 and the first valve V1 is opened at time t2 after the first time tx passes from time t1, so that there is no delay for the chamber pressure to increase from the first pressure P1 to the desired second pressure P2. In other words, the responsiveness of the chamber pressure to the operation of the first valve V1 and the second valve V2 when increasing the chamber pressure is improved.

In addition, as shown in FIG. 15, the second valve V2 is closed at time t3 and the first valve V1 is closed at time t4 after the second time ty passes from time t3, so that there is no delay for the chamber pressure to decrease from the second pressure P2 to the desired first pressure P1. In other words, the responsiveness of the chamber pressure to the operation of the first valve V1 and the second valve V2 when decreasing the chamber pressure is improved.

By improving the responsiveness of the chamber pressure to the operation of the first valve V1 and the second valve V2, for example, the timing of starting and stopping the supply of the source gas matches the actual timing of film formation or vacuuming. As a result, it becomes easy to control the film forming process. In addition, for example, since the cycle time can be shortened, the film formation time can be shortened.

Next, a method for determining the first time tx and the second time ty in the film forming apparatus and the film forming method according to the second embodiment will be described.

Figure 16:
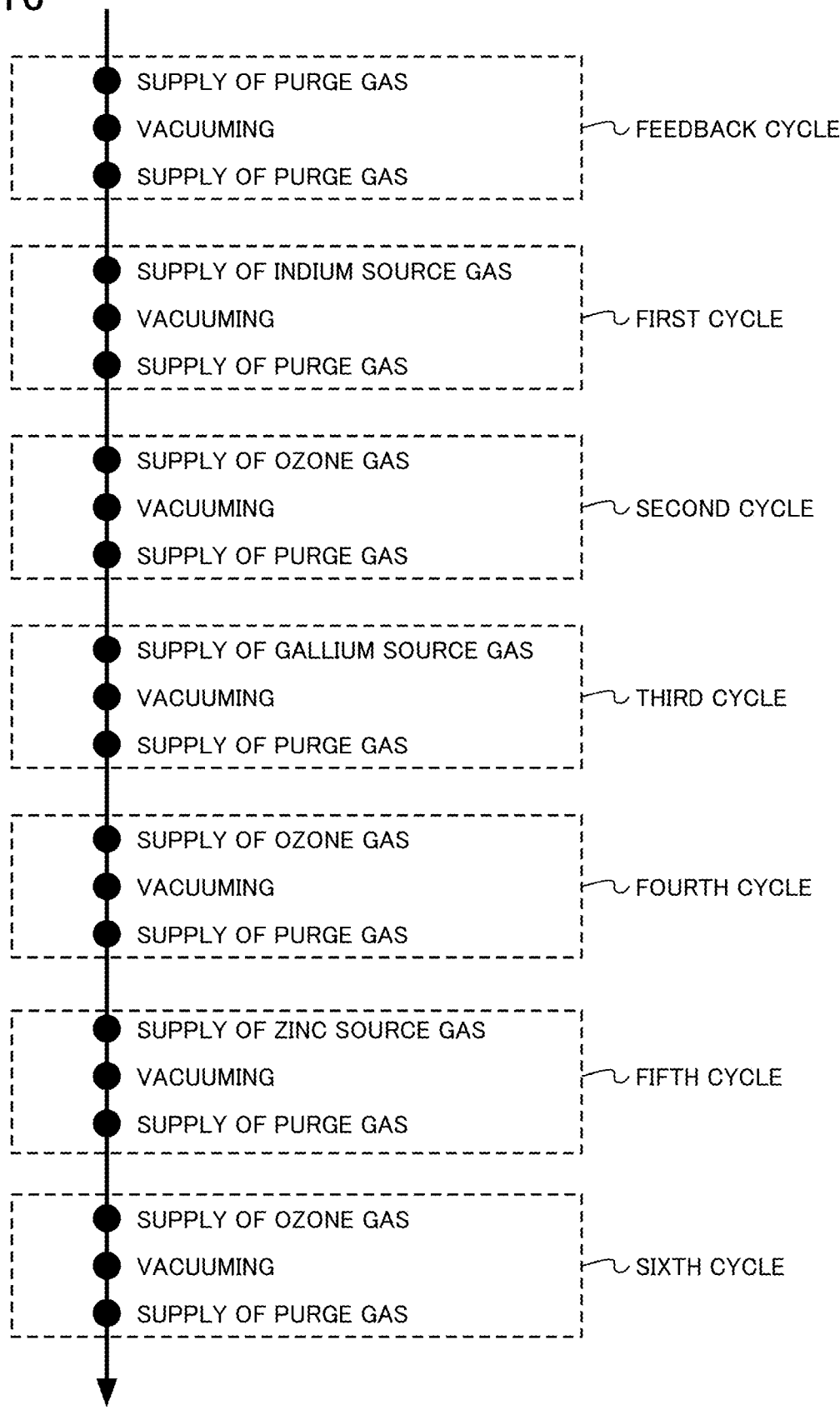
FIG. 16 is an explanatory diagram of the film forming method according to the second embodiment.

FIG. 16 is an explanatory diagram of the film forming method according to the second embodiment. FIG. 16 is a diagram showing a part of a process sequence when forming an indium gallium zinc oxide film by ALD.

As shown in FIG. 16, for example, a feedback cycle is performed before starting the formation of the indium gallium zinc oxide film. By performing the feedback cycle, the first time tx and the second time ty are determined, and the first time tx and the second time ty are fed back to the cycle for film formation.

For example, the feedback cycle is performed before the first cycle. Specifically, before the second valve V2 provided in the pressure control gas supply pipe 22 is opened to supply the nitrogen gas into the chamber and before the first valve V1 provided in the first source gas supply pipe 16 is opened to supply the indium source gas into the chamber 10, the feedback cycle is performed. The nitrogen gas is an example of the second gas. The indium source gas is an example of the first gas.

First, the semiconductor wafer W is loaded into the chamber 10. Then, the loaded semiconductor wafer W is placed on the holder 14.

Then, the exhaust device 32 is driven to reduce the pressure in the chamber 10 to a predetermined pressure. At this time, the semiconductor wafer W is heated by, for example, a heater (not shown).

Then, the second valve V2 provided in the pressure control gas supply pipe 22 and the third valve V3 provided in the purge gas supply pipe 20 are opened at the same time.

By opening the second valve V2, a nitrogen gas, which is an example of the pressure control gas, is supplied from the pressure control gas supply pipe 22 into the chamber 10 through the pressure control gas supply hole 24. By supplying the nitrogen gas into the chamber 10, the exhaust of gas from the chamber 10 is suppressed to increase the pressure in the chamber 10. The pressure control gas supply pipe 22 is an example of the second gas supply pipe. The nitrogen gas is an example of the second gas.

In addition, by opening the third valve V3, a nitrogen gas, which is an example of the purge gas, is supplied into the chamber 10 through the shower head 12. The purge gas supply pipe 20 is an example of the third gas supply pipe. The nitrogen gas is an example of the third gas.

After a predetermined time passes, the second valve V2 provided in the pressure control gas supply pipe 22 and the third valve V3 provided in the purge gas supply pipe 20 are closed at the same time.

By closing the second valve V2, the supply of the nitrogen gas into the chamber 10 is stopped. By stopping the supply of the nitrogen gas into the chamber 10, the exhaust of gas from the chamber 10 is promoted to reduce the pressure in the chamber 10.

In addition, by closing the third valve V3, the supply of the nitrogen gas into the chamber 10 is stopped.

The supply of the nitrogen gas into the chamber 10 is stopped, and the vacuuming of the chamber 10 is performed.

Then, the third valve V3 provided in the purge gas supply pipe 20 is opened. By opening the third valve V3, a nitrogen gas, which is an example of the purge gas, is supplied into the chamber 10 through the shower head 12.

Then, the third valve V3 provided in the purge gas supply pipe 20 is closed. The supply of the nitrogen gas into the chamber 10 is stopped, and the purging process for the chamber 10 ends.

As described above, the feedback cycle shown in FIG. 16 ends. No film is formed on the semiconductor wafer W during the feedback cycle because the source gas does not flow. Thereafter, for example, a first cycle, a second cycle, a third cycle, a fourth cycle, a fifth cycle, and a sixth cycle are performed to form an indium gallium zinc oxide film.

In addition, during the feedback cycle, the chamber pressure is monitored by using the pressure gauge 36.

FIG. 17 is an explanatory diagram of the film forming method according to the second embodiment. The upper diagram in FIG. 17 shows the opening/closing timing of the third valve and the opening/closing timing of the second valve in the feedback cycle. The lower diagram in FIG. 17 shows a change in chamber pressure over time.

In the feedback cycle, the first time tx for the chamber pressure to increase from the first pressure P1 to the desired second pressure P2 after the third valve V3 and the second valve V2 are opened at the same time is measured. In addition, the second time ty for the chamber pressure to decrease from the second pressure P2 to the desired first pressure P1 after the third valve V3 and the second valve V2 are closed at the same time is measured.

The measured first time tx and second time ty are stored in the storage device of the control unit 40, for example. For example, in the first, second, third, fourth, fifth, and sixth cycles following the feedback cycle, film formation is performed based on the first time tx and the second time ty stored in the storage device of the control unit 40.

The first time tx and the second time ty measured in the feedback cycle may not necessarily match the first time tx and the second time ty applied to the subsequent film formation cycle. For example, by performing predetermined arithmetic processing on the first time tx and the second time ty measured in the feedback cycle, the first time tx and the second time ty applied to the subsequent film formation cycle may be determined.

In addition, the third gas containing an inert gas used in the feedback cycle is not limited to the nitrogen gas. For example, an argon gas, a xenon gas, or a neon gas can be used. In addition, in the second embodiment, the purge gas supplied from the purge gas supply pipe 20 is used as the third gas containing the inert gas. However, for example, a configuration in which a separate gas supply pipe dedicated to the feedback cycle is provided is also possible.

Although the case where both the second valve V2 and the third valve V3 are opened and closed in the feedback cycle has been described as an example, it is also possible to open and close only either the second valve V2 or the third valve V3, for example.

In the film forming method according to the second embodiment, the frequency of performing a feedback cycle is arbitrary. For example, it is also possible to always perform a feedback cycle during film formation. In addition, for example, it is possible to perform a feedback cycle every predetermined number of film formations. In addition, for example, by continuously performing a plurality of feedback cycles, the first time tx and the second time ty can be set to the average value of the first time tx and the average value of the second time ty of a plurality of feedback runs, respectively.

As described above, according to the film forming apparatus and the film forming method according to the second embodiment, it is possible to shorten the film formation time.

Third Embodiment

A film forming apparatus according to a third embodiment includes: a chamber; a shower head provided in an upper part of the chamber; a holder provided in the chamber holding a substrate; a first gas supply pipe supplying a first gas to the shower head; a first valve provided in the first gas supply pipe; a first gas exhaust pipe exhausting a gas from the chamber; a second gas exhaust pipe exhausting a gas from the shower head; a second gas supply pipe supplying a second gas to the second gas exhaust pipe; a second valve provided in the second gas supply pipe; a first exhaust device connected to the first gas exhaust pipe; and a second exhaust device connected to the second gas exhaust pipe.

Figure 18:
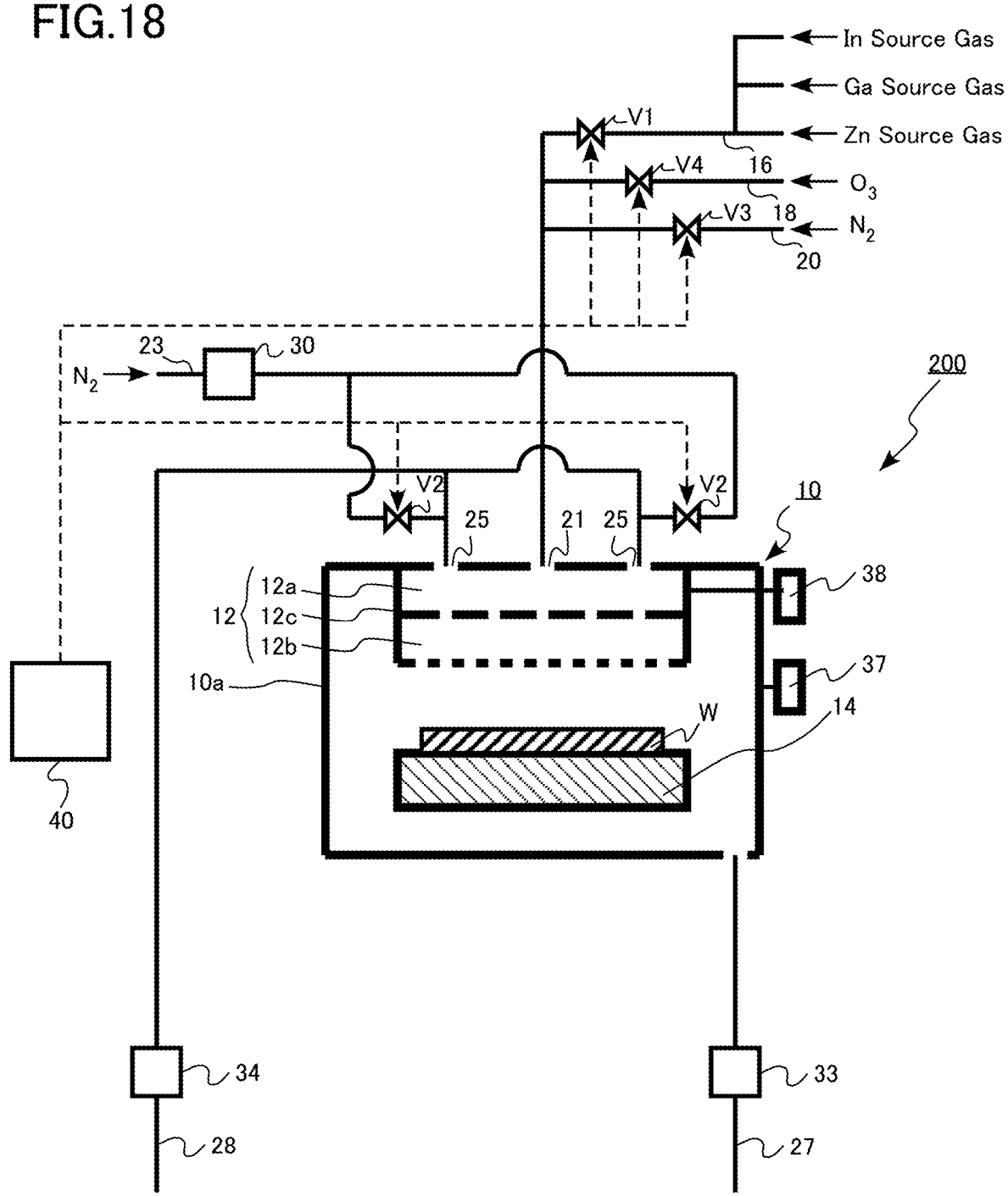
FIG. 18 is a schematic diagram of a film forming apparatus according to a third embodiment.

FIG. 18 is a schematic diagram of the film forming apparatus according to the third embodiment. The film forming apparatus according to the third embodiment is a film forming apparatus 200 that forms a film using atomic layer deposition (ALD). The film forming apparatus 200 is a single wafer type film forming apparatus that forms a film on one substrate in one film forming process.

The film forming apparatus 200 includes, for example, a chamber 10, a shower head 12, a holder 14, a first source gas supply pipe 16, a second source gas supply pipe 18, a purge gas supply pipe 20, a gas supply hole 21, an exhaust control gas supply pipe 23, a gas exhaust hole 25, a first gas exhaust pipe 27, a second gas exhaust pipe 28, a regulator 30, a first exhaust device 33, a second exhaust device 34, a first pressure gauge 37, a second pressure gauge 38, and a control unit 40. The chamber 10 includes a sidewall 10a. The shower head 12 includes an upper layer portion 12a, a lower layer portion 12b, and a diffusion plate 12c. In addition, the film forming apparatus 200 includes a first valve V1, a second valve V2, a third valve V3, and a fourth valve V4.

The first source gas supply pipe 16 is an example of the first gas supply pipe. The exhaust control gas supply pipe 23 is an example of the second gas supply pipe.

Film formation is performed inside the chamber 10. The chamber 10 includes the sidewall 10a. The sidewall 10a surrounds the shower head 12 and the holder 14, for example.

The shower head 12 is provided in the upper part of the chamber 10. The shower head 12 supplies a gas supplied from the first source gas supply pipe 16, the second source gas supply pipe 18, and the purge gas supply pipe 20 into the chamber 10 in the form of a shower.

The shower head 12 includes the upper layer portion 12a, the lower layer portion 12b, and the diffusion plate 12c. The lower layer portion 12b is provided between the chamber 10 and the upper layer portion 12a. The diffusion plate 12c is provided between the upper layer portion 12a and the lower layer portion 12b. The diffusion plate 12c includes a plurality of openings for making the upper layer portion 12a and the lower layer portion 12b communicate with each other.

Figure 19:
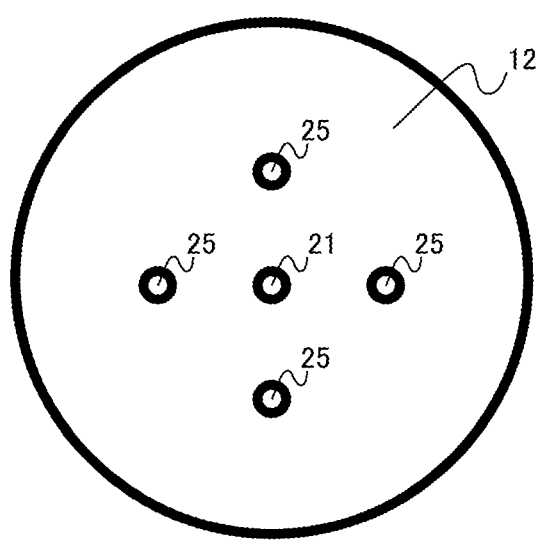
FIG. 19 is a schematic diagram of the film forming apparatus according to the third embodiment.

FIG. 19 is a schematic diagram of the film forming apparatus according to the third embodiment. FIG. 19 is a top view of the shower head 12. The gas supply hole 21 and the gas exhaust hole 25 are provided in the shower head 12. For example, a plurality of gas exhaust holes 25 are provided. The second gas exhaust pipe 28 is connected to the gas exhaust hole 25.

The holder 14 is provided in the chamber 10. For example, a semiconductor wafer W is placed on the holder 14. The semiconductor wafer W is an example of a substrate.

For example, a heater (not shown) is provided inside the holder 14. It is possible to heat the semiconductor wafer W by the heater.

The first source gas supply pipe 16 is connected to the shower head 12. The first source gas supply pipe 16 is connected to the gas supply hole 21. The first source gas supply pipe 16 supplies a first source gas to the shower head 12. The first source gas is an example of the first gas. The first source gas contains, for example, a metal element.

The first source gas is, for example, a gas containing indium (In). The first source gas is, for example, trimethylindium.

The first source gas is, for example, a gas containing gallium (Ga). The first source gas is, for example, trimethylgallium.

The first source gas is, for example, a gas containing zinc (Zn). The first source gas is, for example, dimethylzinc.

For example, as the first source gas, one of the gas containing indium (In), the gas containing gallium (Ga), and the gas containing zinc (Zn) can be selected by controlling an on-off valve (not shown).

The first valve V1 is provided in the first source gas supply pipe 16. The start and stop of the supply of the first source gas to the shower head 12 are controlled by opening and closing the first valve V1.

The second source gas supply pipe 18 is connected to the shower head 12. The second source gas supply pipe 18 is connected to the gas supply hole 21. The second source gas supply pipe 18 supplies a second source gas to the shower head 12. The second source gas is an example of the first gas.

The second source gas is, for example, a gas containing oxygen (O). The second source gas is, for example, an ozone gas.

The fourth valve V4 is provided in the second source gas supply pipe 18. The start and stop of the supply of the second source gas to the shower head 12 are controlled by opening and closing the fourth valve V4.

The purge gas supply pipe 20 is connected to the shower head 12. The purge gas supply pipe 20 is connected to the gas supply hole 21. The purge gas supply pipe 20 supplies a purge gas to the shower head 12.

The purge gas contains, for example, an inert gas. The purge gas is, for example, a nitrogen gas, an argon gas, a xenon gas, or a neon gas.

The third valve V3 is provided in the purge gas supply pipe 20. The start and stop of the supply of the purge gas to the shower head 12 are controlled by opening and closing the third valve V3.

The exhaust control gas supply pipe 23 is connected to the second gas exhaust pipe 28. The exhaust control gas supply pipe 23 supplies the exhaust control gas to the second gas exhaust pipe 28.

The exhaust control gas contains, for example, an inert gas. The pressure control gas is, for example, a nitrogen gas, an argon gas, a xenon gas, or a neon gas.

The second valve V2 is provided in the exhaust control gas supply pipe 23. The start and stop of the supply of the exhaust control gas to the second gas exhaust pipe 28 are controlled by opening and closing the second valve V2.

The second valve V2 is a high speed valve. The second valve is, for example, a valve whose opening/closing speed is equal to or more than 1 msec and equal to or less than 100 msec. The second valve V2 has only one degree of opening, for example. The second valve V2 is, for example, a valve that performs only opening and closing operations.

The regulator 30 is provided in the exhaust control gas supply pipe 23. The second valve V2 is provided between the regulator 30 and the second gas exhaust pipe 28.

The regulator 30 has a function of controlling the pressure of the pressure control gas before the second valve V2 opens to be a predetermined pressure. The regulator 30 is fixed to have a predetermined degree of opening during the formation of a film on the semiconductor wafer W.

The first gas exhaust pipe 27 is provided below the chamber 10, for example. The residual gas in the chamber 10 is exhausted out of the chamber 10 through the first gas exhaust pipe 27. For example, the unconsumed first source gas, the unconsumed second source gas, a buffer gas, or reaction products are exhausted out of the chamber 10 through the first gas exhaust pipe 27.

The first exhaust device 33 is connected to the first gas exhaust pipe 27. The first exhaust device 33 is, for example, a vacuum pump.

The second gas exhaust pipe 28 is connected to the shower head 12. The second gas exhaust pipe 28 is connected to the gas exhaust hole 25 of the shower head 12. The residual gas in the shower head 12 is exhausted out of the chamber 10 through the second gas exhaust pipe 28. Through the second gas exhaust pipe 28, for example, the unconsumed first source gas, the unconsumed second source gas, a buffer gas, or reaction products are exhausted out of the shower head 12.

The second exhaust device 34 is connected to the second gas exhaust pipe 28. The second exhaust device 34 is, for example, a vacuum pump.

The first pressure gauge 37 has a function of measuring the pressure in the chamber 10. The second pressure gauge 38 has a function of measuring the pressure in the shower head 12.

The control unit 40 has a function of controlling the film forming operation of the film forming apparatus 200. For example, the control unit 40 controls opening and closing of the first valve V1. For example, the control unit 40 controls opening and closing of the second valve V2. For example, the control unit 40 controls opening and closing of the third valve V3. For example, the control unit 40 controls opening and closing of the fourth valve V4.

The control unit 40 is, for example, a control circuit. The control unit 40 is, for example, an electronic circuit. The control unit 40 includes, for example, hardware and software.

The control unit 40 includes, for example, a central processing unit (CPU). The control unit 40 includes, for example, a storage device. The storage device included in the control unit 40 is, for example, a semiconductor memory, a solid state device (SSD), or a hard disk.

Next, a film forming method according to the third embodiment will be described. The film forming method according to the third embodiment is a film forming method using a film forming apparatus including: a chamber; a shower head provided in an upper part of the chamber; a holder provided in the chamber holding a substrate; a first gas supply pipe supplying a first gas to the shower head; a first valve provided in the first gas supply pipe; a first gas exhaust pipe exhausting a gas from the chamber; a second gas exhaust pipe exhausting a gas from the shower head; a second gas supply pipe supplying a second gas to the second gas exhaust pipe; a second valve provided in the second gas supply pipe; a first exhaust device connected to the first gas exhaust pipe; and a second exhaust device connected to the second gas exhaust pipe. The film forming method includes: loading a substrate into the chamber; placing the substrate on the holder; driving the first exhaust device to reduce a pressure in the chamber; driving the second exhaust device to reduce a pressure in the shower head; opening the second valve to supply the second gas containing an inert gas from the second gas supply pipe to the second gas exhaust pipe; opening the first valve to supply the first gas containing a metal element into the chamber through the shower head; closing the second valve; closing the first valve; and reducing the pressure in the shower head and the pressure in the chamber.

In the film forming method according to the third embodiment, a film containing a metal element is formed on the semiconductor wafer W by ALD using a film forming apparatus 300 according to the third embodiment. Hereinafter, a case of forming an oxide film containing indium (In), gallium (Ga), and zinc (Zn), that is, an indium gallium zinc oxide film will be described as an example.

Figure 20:
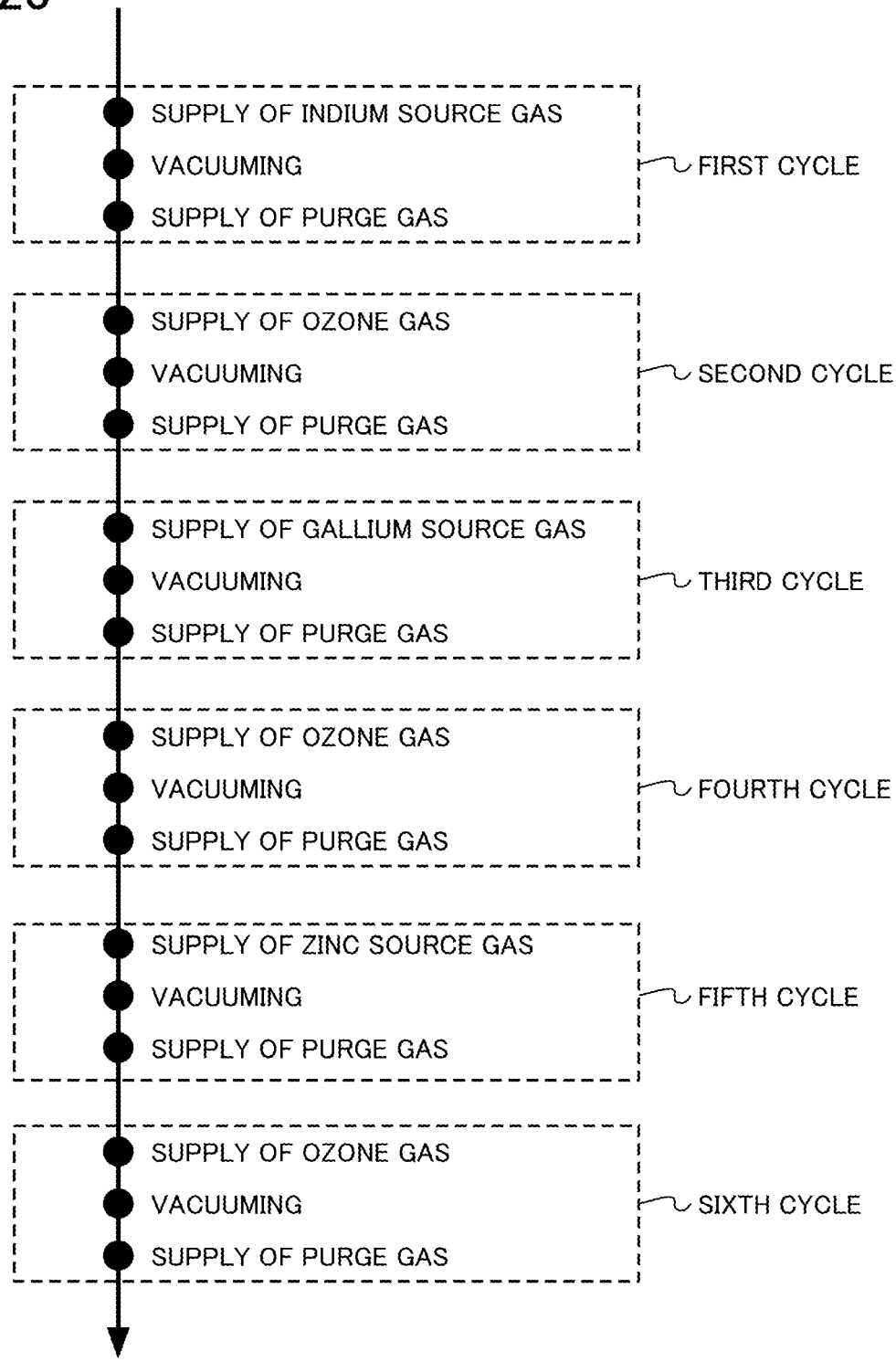
FIG. 20 is an explanatory diagram of a film forming method according to the third embodiment.

FIG. 20 is an explanatory diagram of the film forming method according to the third embodiment. FIG. 20 is a diagram showing a part of a process sequence when forming an indium gallium zinc oxide film by ALD.

As shown in FIG. 20, when forming an indium gallium zinc oxide film by ALD, for example, an atomic layer of indium is formed in the first cycle and an atomic layer of oxygen is formed in the second cycle, thereby forming a molecular layer of indium oxide. Then, an atomic layer of gallium is formed in the third cycle and an atomic layer of oxygen is formed in the fourth cycle, thereby forming a molecular layer of gallium oxide. Then, an atomic layer of zinc is formed in the fifth cycle and an atomic layer of oxygen is formed in the sixth cycle, thereby forming a molecular layer of zinc oxide.

In all of the cycles, the supply of a source gas, vacuuming, and the supply of a purge gas are performed. By performing vacuuming and supplying the purge gas, a source gas remaining in the chamber is exhausted to the outside of the chamber.

By repeating the first cycle to the sixth cycle a predetermined number of times, an indium gallium zinc oxide film having a desired thickness is formed.

FIGS. 21 to 26 are explanatory diagrams of the film forming method according to the third embodiment. FIGS. 21 to 26 are diagrams showing the operation of the film forming apparatus 200. FIGS. 21 to 26 are explanatory diagrams of the first cycle in FIG. 20.

Figure 21:
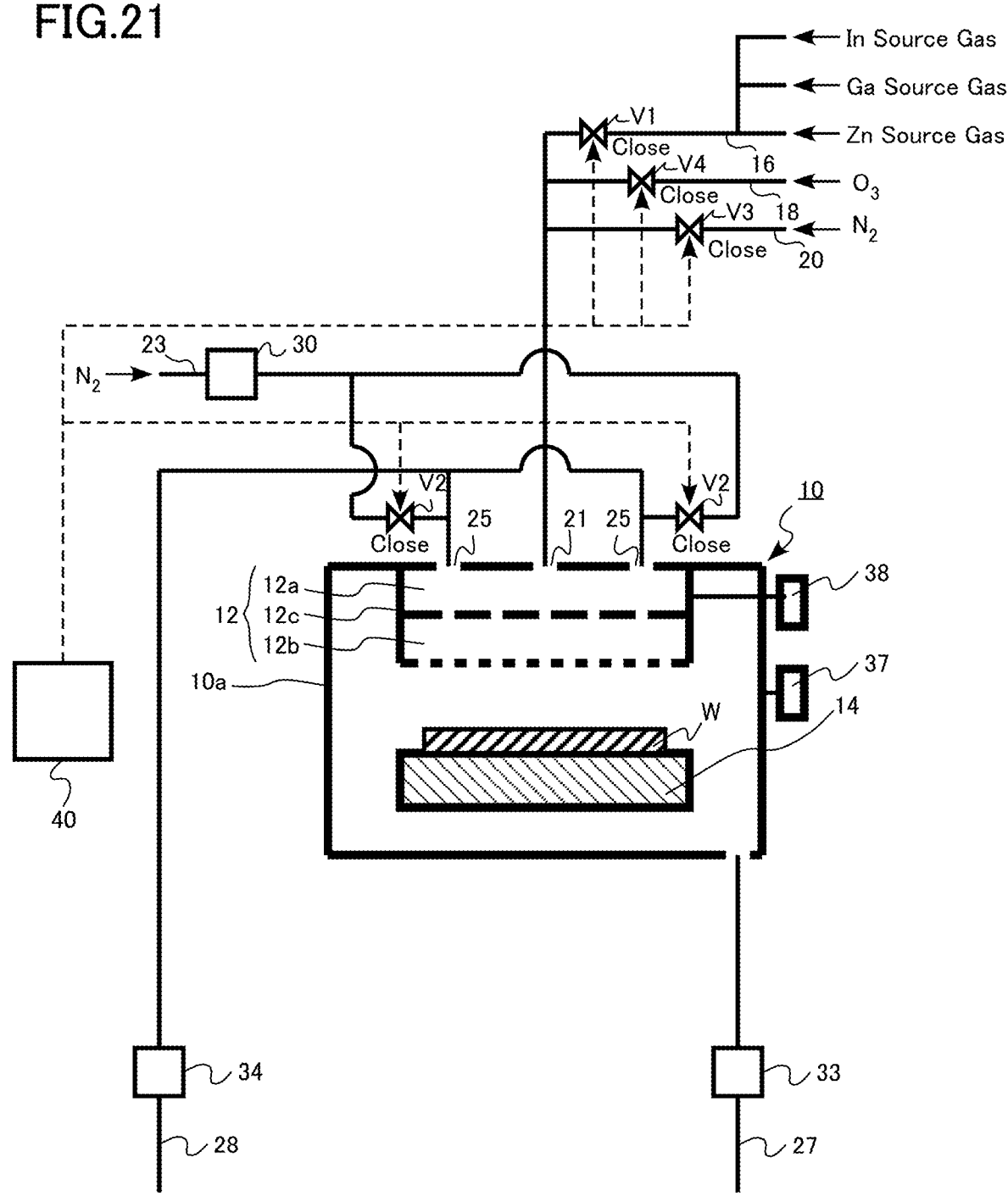
FIG. 21 is an explanatory diagram of the film forming method according to the third embodiment.

First, the semiconductor wafer W is loaded into the chamber 10. Then, the loaded semiconductor wafer W is placed on the holder 14 (FIG. 21).

Figure 22:
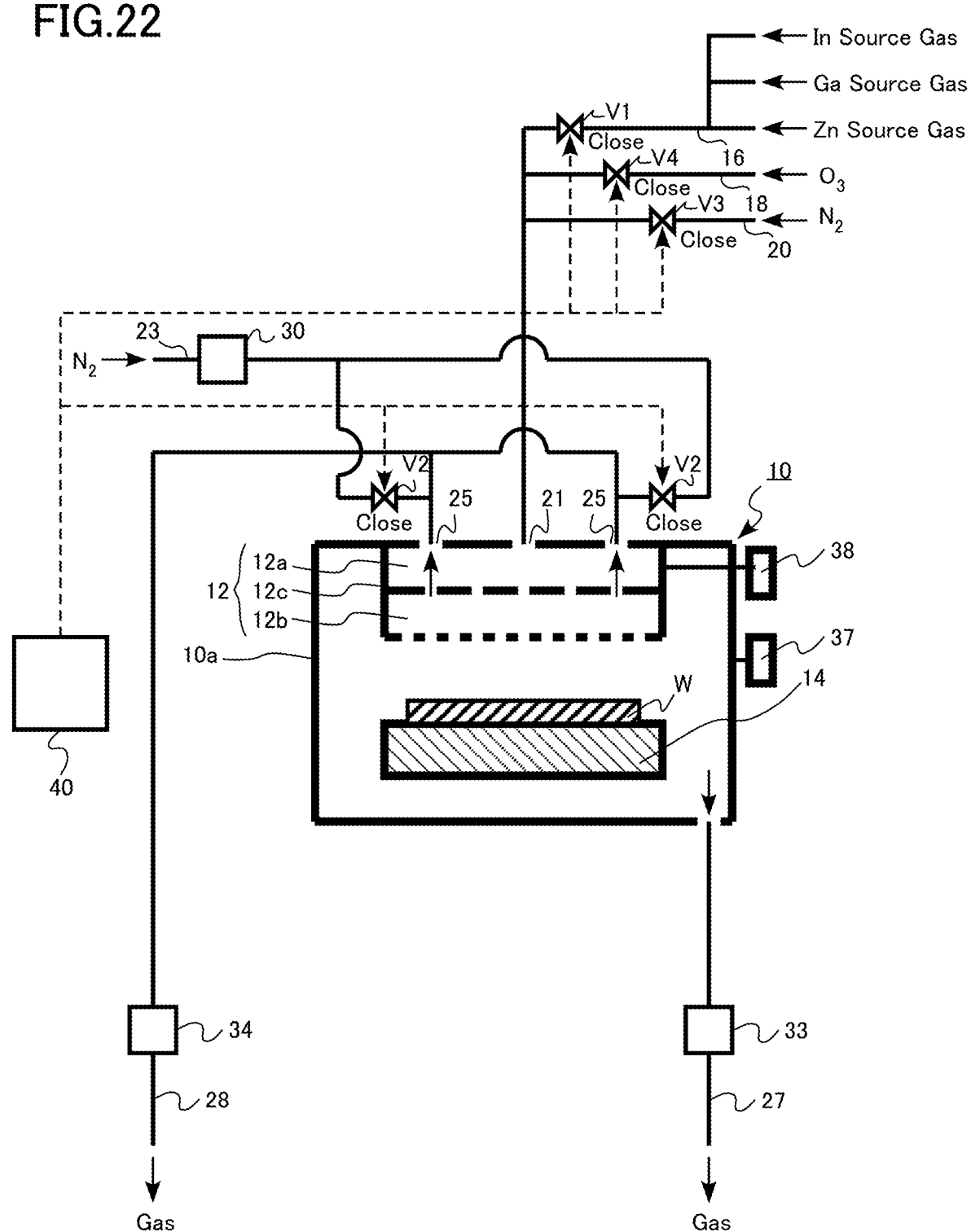
FIG. 22 is an explanatory diagram of the film forming method according to the third embodiment.

Then, the pressure in the shower head 12 and the pressure in the chamber 10 are reduced to predetermined pressures by driving the first exhaust device 33 and the second exhaust device 34 (FIG. 22). At this time, the semiconductor wafer W is heated by, for example, a heater (not shown).

Figure 23:
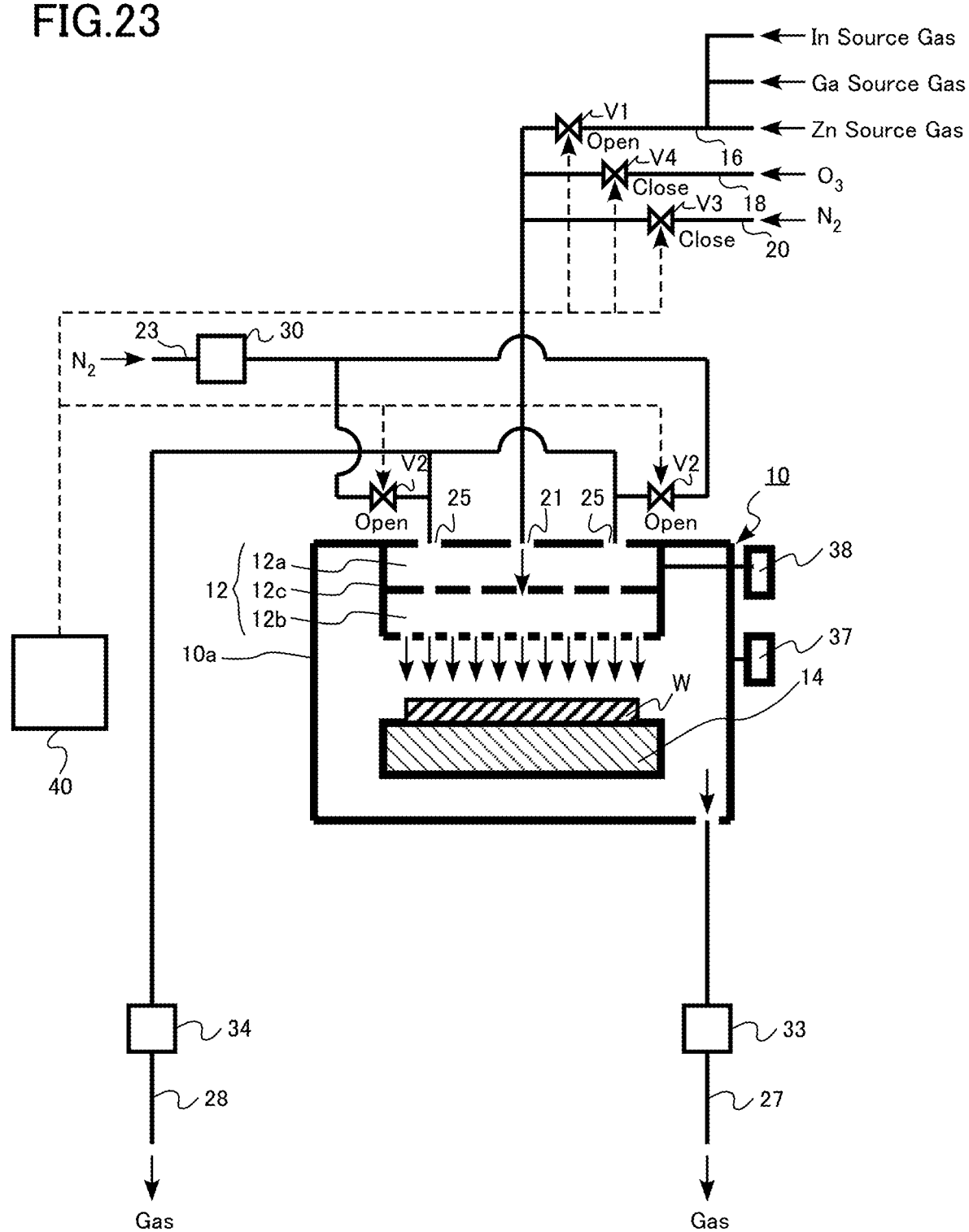
FIG. 23 is an explanatory diagram of the film forming method according to the third embodiment.

Then, the second valve V2 provided in the exhaust control gas supply pipe 23 is opened. By opening the second valve V2, a nitrogen gas, which is an example of the exhaust control gas, is supplied from the exhaust control gas supply pipe 23 to the second gas exhaust pipe 28 (FIG. 23). By supplying the nitrogen gas into the second gas exhaust pipe 28, the exhaust of the gas from the shower head 12 is stopped to increase the pressure in the shower head 12.

The exhaust control gas supply pipe 23 is an example of the second gas supply pipe. The nitrogen gas is an example of the second gas.

At the same time as opening the second valve V2, the first valve V1 provided in the first source gas supply pipe 16 is opened. By opening the first valve V1, the indium source gas is supplied into the chamber 10 through the shower head 12 (FIG. 23). Indium of the source gas is adsorbed on the surface of the semiconductor wafer W, so that an atomic layer of indium is formed. In addition, the timing of opening the second valve V2 and the timing of opening the first valve V1 may not completely match each other. The timing of opening the second valve V2 and the timing of opening the first valve V1 may be different.

Figure 24:
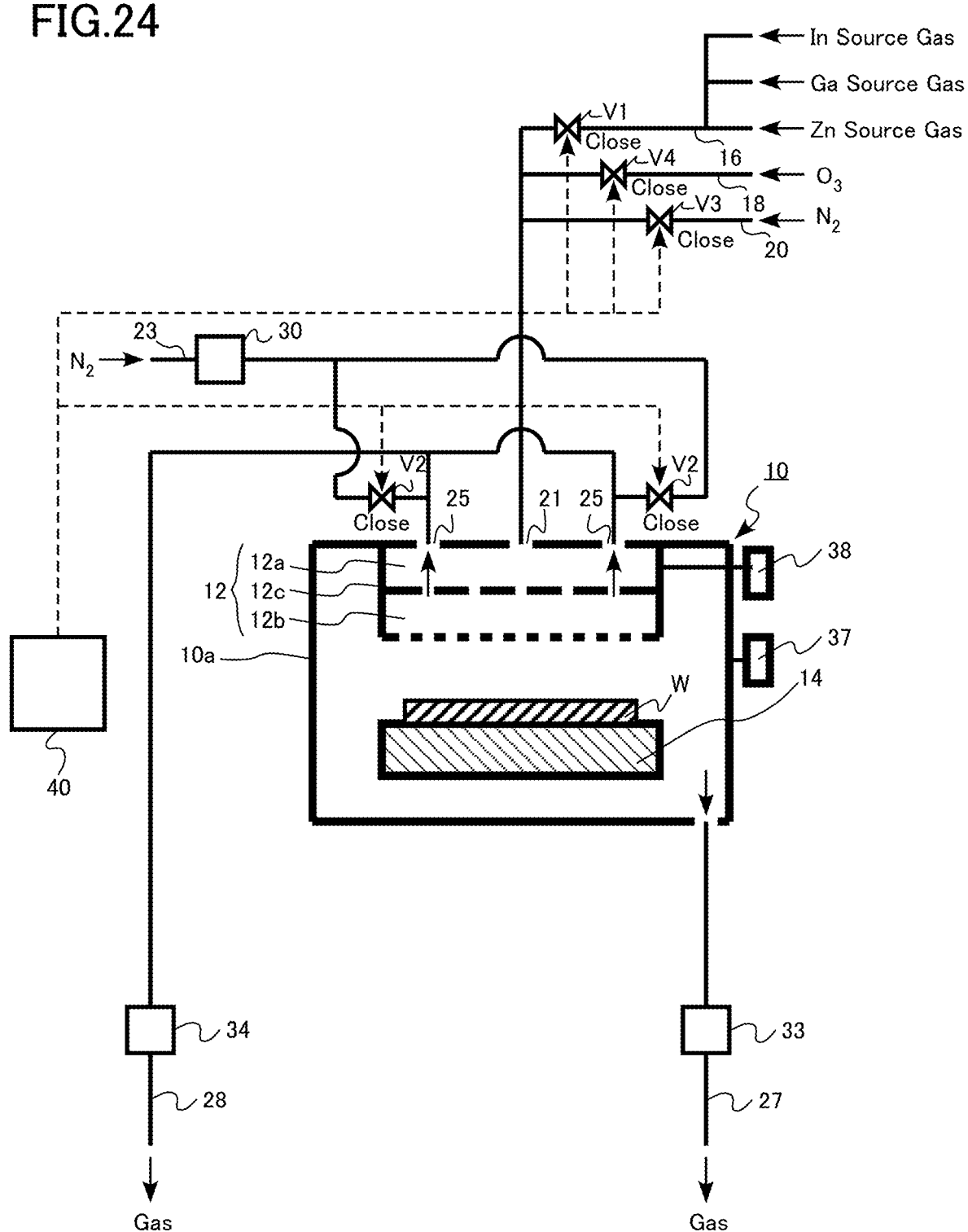
FIG. 24 is an explanatory diagram of the film forming method according to the third embodiment.

After a predetermined time passes and an atomic layer of indium is formed on the semiconductor wafer W, the second valve V2 provided in the exhaust control gas supply pipe 23 is closed. By closing the second valve V2, the supply of the nitrogen gas to the second gas exhaust pipe 28 is stopped (FIG. 24). By stopping the supply of the nitrogen gas to the second gas exhaust pipe 28, the exhaust of the gas from the shower head 12 is started to reduce the pressure in the shower head 12.

At the same time as closing the second valve V2, the first valve V1 provided in the first source gas supply pipe 16 is closed. By closing the first valve V1, the supply of the indium source gas into the chamber 10 is stopped (FIG. 24). In addition, the timing of closing the second valve V2 and the timing of closing the first valve V1 may not completely match each other. The timing of closing the second valve V2 and the timing of closing the first valve V1 may be different.

The supply of the nitrogen gas into the shower head 12 and the supply of the indium source gas into the chamber 10 are stopped to vacuum the chamber 10.

Figure 25:
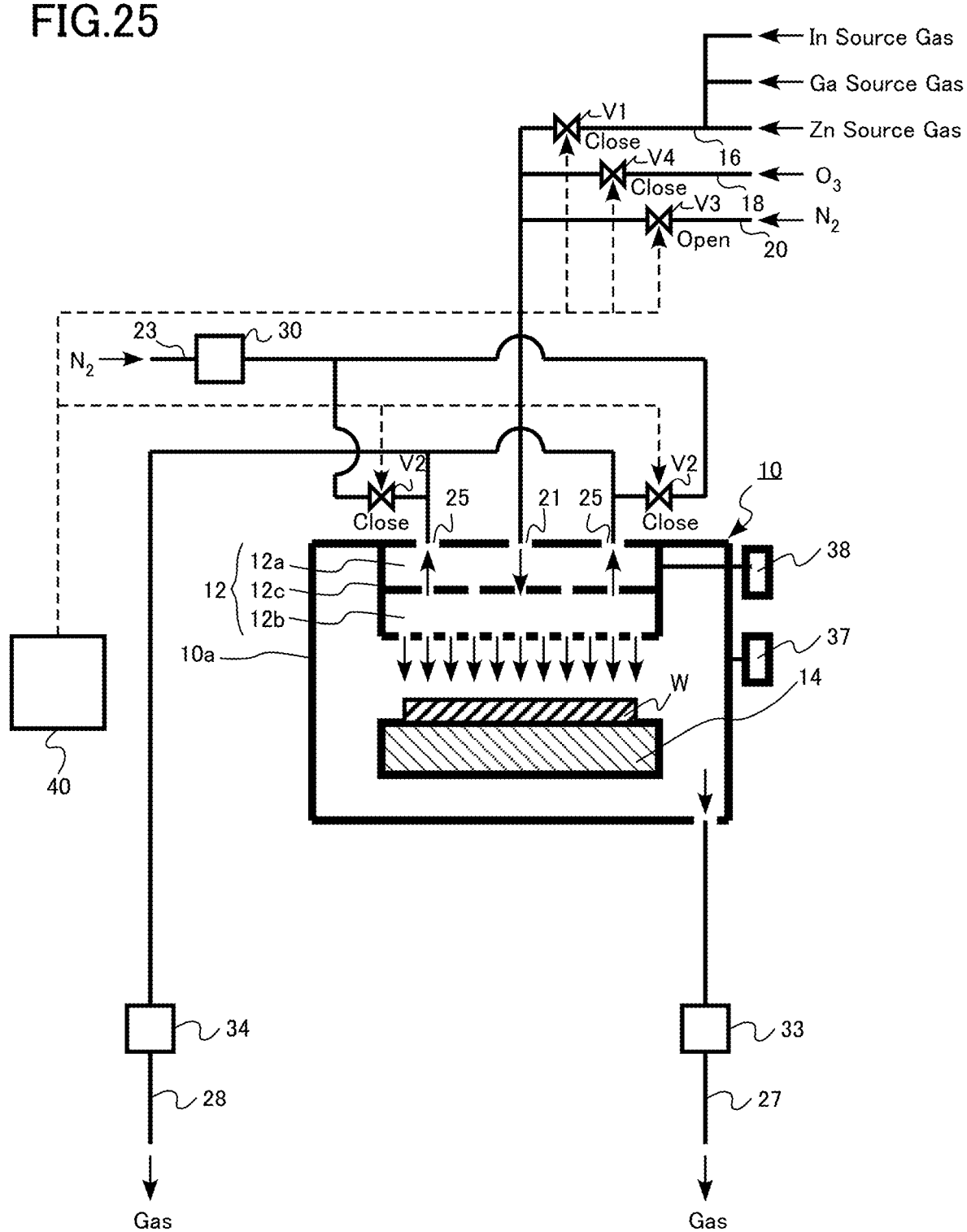
FIG. 25 is an explanatory diagram of the film forming method according to the third embodiment.

Then, the third valve V3 provided in the purge gas supply pipe 20 is opened. By opening the third valve V3, a nitrogen gas, which is an example of the purge gas, is supplied into the chamber 10 through the shower head 12 (FIG. 25).

Figure 26:
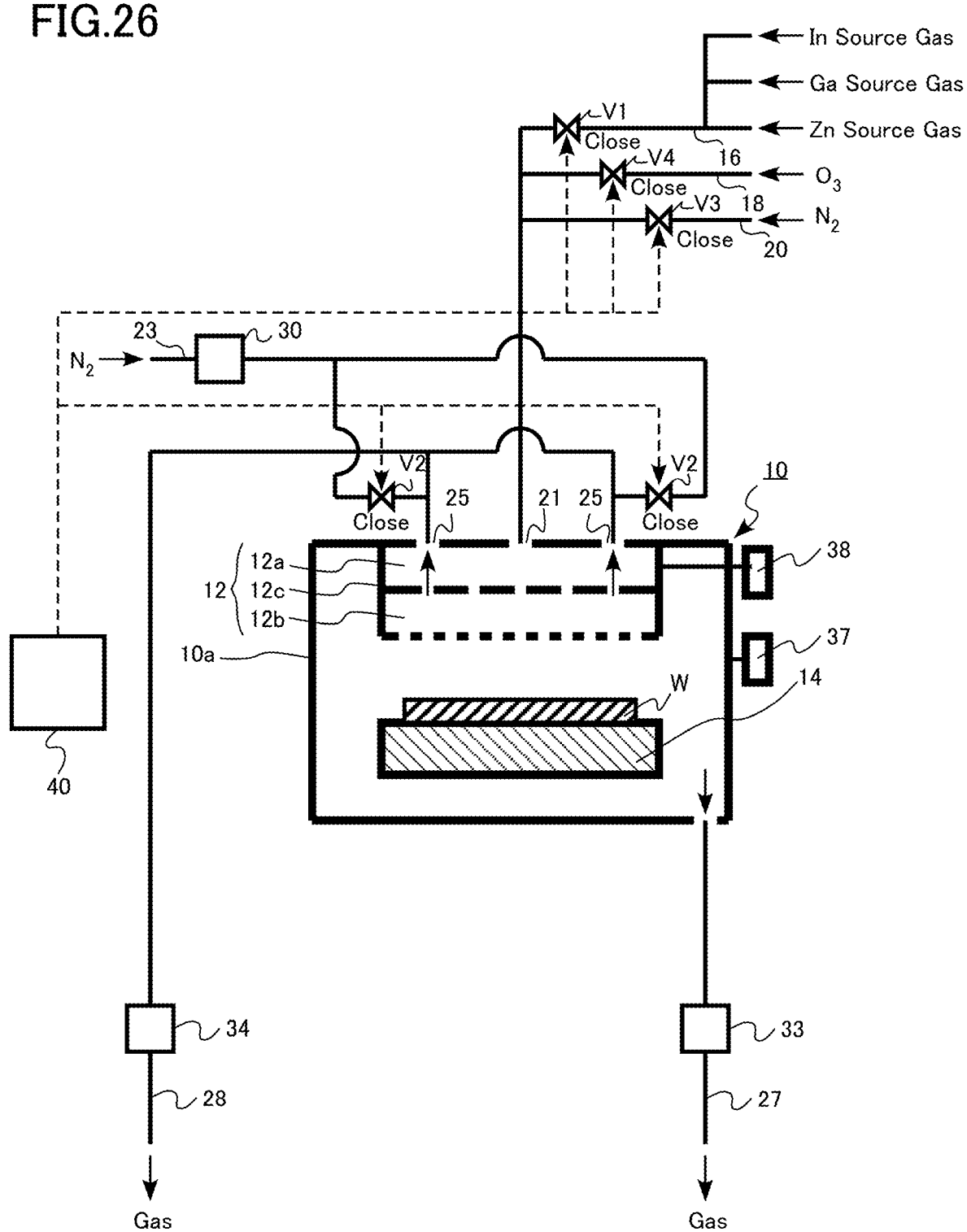
FIG. 26 is an explanatory diagram of the film forming method according to the third embodiment.

Then, the third valve V3 provided in the purge gas supply pipe 20 is closed (FIG. 26). The supply of the nitrogen gas into the chamber 10 is stopped, and the purging process for the chamber 10 ends.

As described above, the first cycle shown in FIG. 20 ends. Thereafter, the source gas is changed, and the second cycle, third cycle, fourth cycle, fifth cycle, and sixth cycle are performed in the same manner as the first cycle.

Next, the function and effect of the film forming apparatus and the film forming method according to the third embodiment will be described.

In film deposition by ALD, assuming that the supply of source gas and the exhaust of residual gas is one cycle, a film is formed by repeating the cycle. For example, if the residual gas is not exhausted sufficiently, the residual source gas may react with the source gas supplied in the subsequent cycle in the gas phase to generate dust. In addition, there is a possibility that the chemical composition of the film will deviate from the desired chemical composition due to the components of the residual source gas being taken into the film.

In particular, when a film is formed by using a compound containing a plurality of different metal elements, such as an indium gallium zinc oxide film, the change in chemical composition has a great effect on the properties. Therefore, it is particularly desirable that the residual gas is sufficiently exhausted.

It takes time to exhaust the residual gas in the shower head 12 due to, for example, narrowing of the gas flow path between the shower head 12 and the gas exhaust pipe provided below the chamber 10. In film deposition using ALD, many cycles are repeated. In order to shorten the film formation time and improve productivity, it is desirable to shorten the time required for one cycle. In particular, in a single wafer type film forming apparatus that forms a film on one substrate in one film forming process, it is desirable to shorten the time required for one cycle. Hereinafter, the time required for one cycle is referred to as a cycle time.

If it takes time to exhaust the residual gas in the shower head 12, the cycle time becomes long and accordingly the film formation time becomes long. Therefore, it is desired to shorten the time required for exhausting the residual gas in the shower head 12.

In the film forming apparatus 300 according to the third embodiment, the second gas exhaust pipe 28 is directly connected to the shower head 12. Therefore, the exhaust of residual gas from the shower head 12 is promoted. As a result, it is possible to shorten the cycle time.

In addition, the film forming apparatus 300 according to the third embodiment controls the stop and start of exhaust from the shower head 12 by controlling the start and stop of the supply of the exhaust control gas from the exhaust control gas supply pipe 23 to the second gas exhaust pipe 28. The control of the supply of the exhaust control gas is performed by controlling opening and closing of the second valve V2. By controlling the start and stop of the supply of the nitrogen gas into the second gas exhaust pipe 28 using the second valve V2 operating at high speed, the time required to increase and decrease the pressure of the shower head 12 is shortened. Therefore, it is possible to further shorten the cycle time.

From the viewpoint of shortening the time required to stop and start the exhaust from the shower head 12, the opening/closing speed of the second valve is preferably equal to or less than 100 msec, more preferably equal to or less than 10 msec.

First Modification Example

A film forming apparatus according to a first modification example of the third embodiment is different from the film forming apparatus according to the third embodiment in that an end portion of the second gas exhaust pipe is connected to the diffusion plate.

Figure 27:
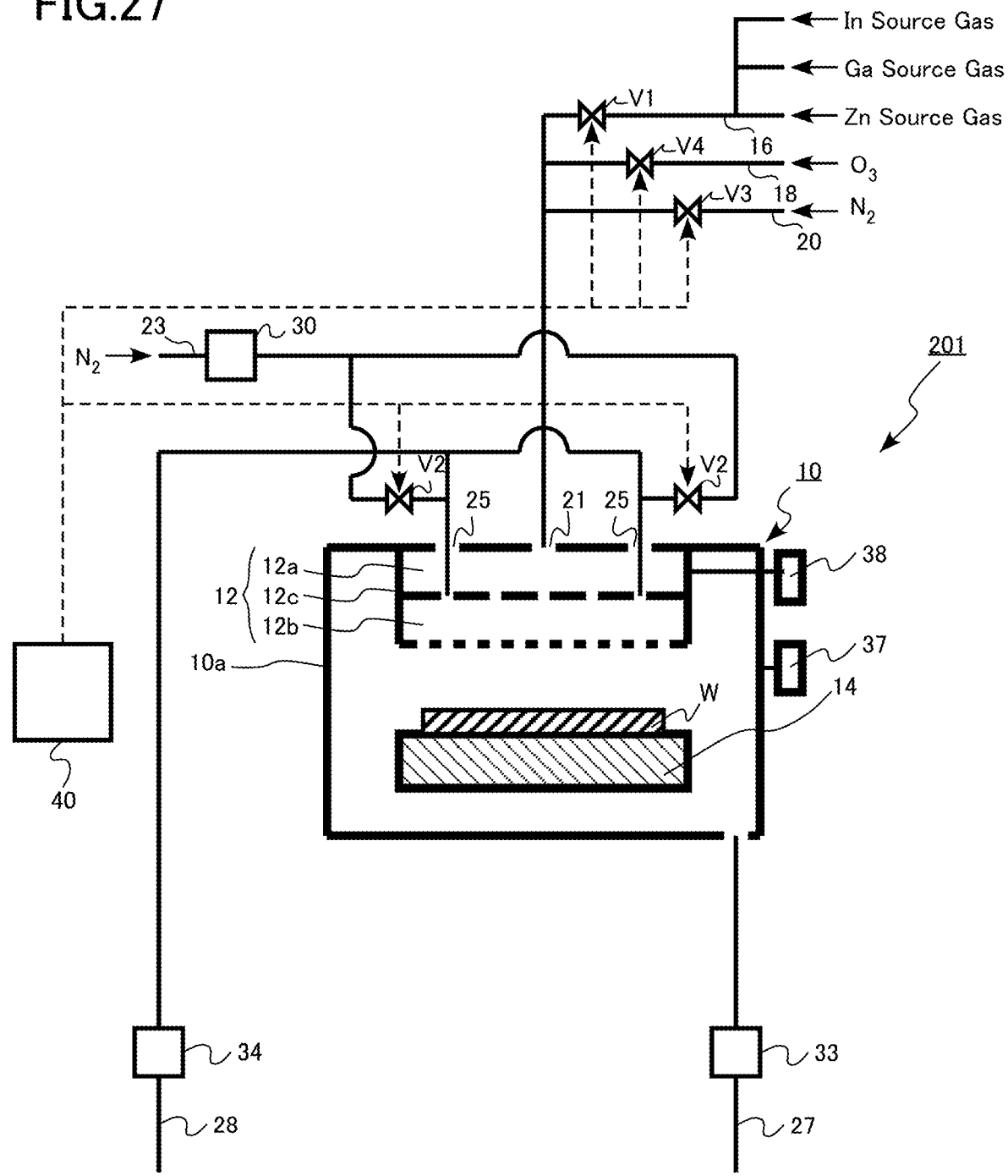
FIG. 27 is a schematic diagram of a film forming apparatus according to a first modification example of the third embodiment.

FIG. 27 is a schematic diagram of the film forming apparatus according to the first modification example of the third embodiment. The film forming apparatus according to the first modification example is a film forming apparatus 201 that forms a film using ALD.

In the film forming apparatus 201, an end portion of the second gas exhaust pipe 28 is connected to the diffusion plate 12c. By connecting the end portion of the second gas exhaust pipe 28 to the diffusion plate 12c, it is possible to efficiently exhaust the residual gas in the lower layer portion 12b of the shower head 12, for example.

Second Modification Example

A film forming apparatus according to a second modification example of the third embodiment is different from the film forming apparatus according to the third embodiment in that the end portion of the second gas exhaust pipe is provided in the lower layer portion.

Figure 28:
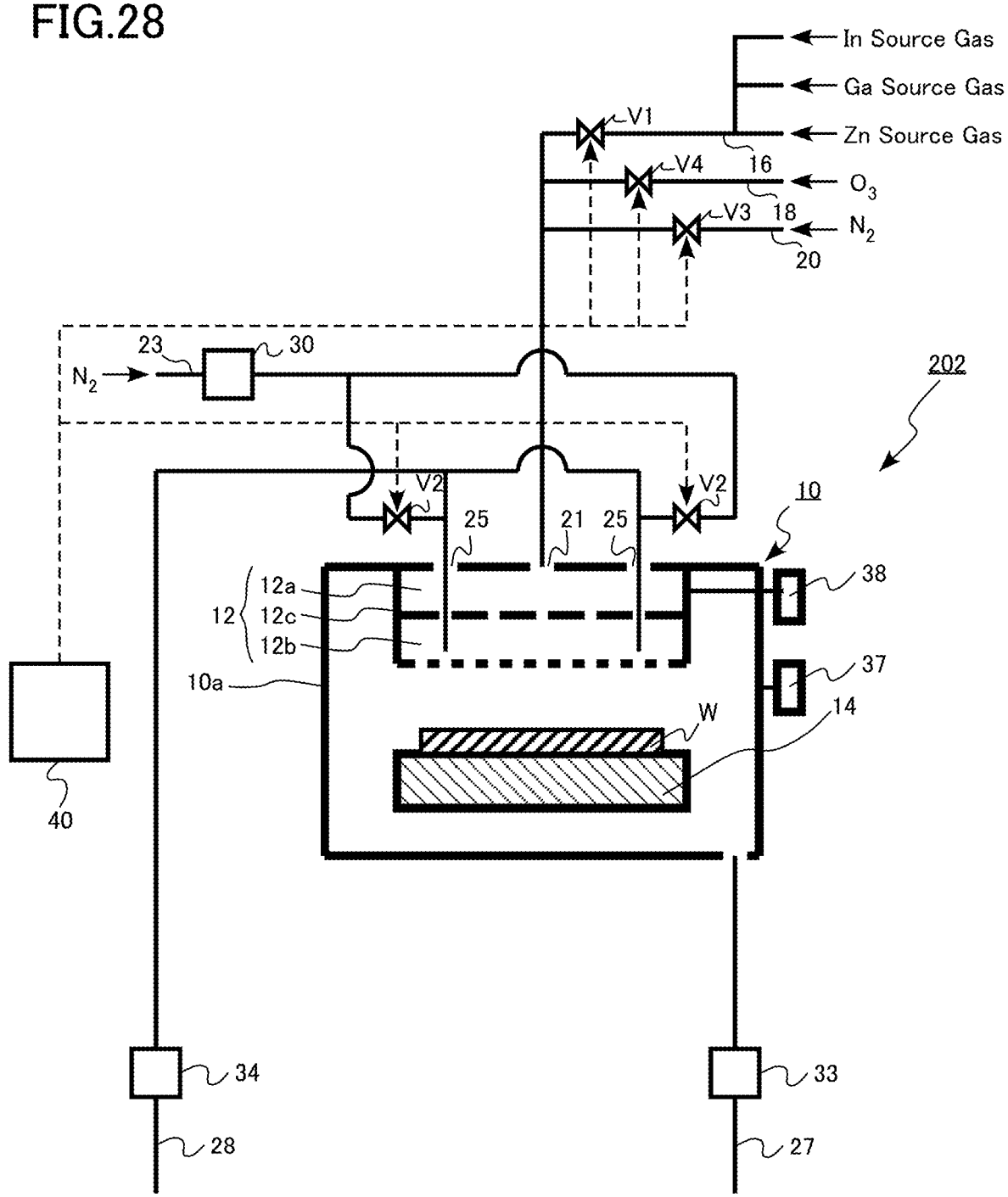
FIG. 28 is a schematic diagram of a film forming apparatus according to a second modification example of the third embodiment.

FIG. 28 is a schematic diagram of the film forming apparatus according to the second modification example of the third embodiment. The film forming apparatus according to the second modification example is a film forming apparatus 202 that forms a film using ALD.

In the film forming apparatus 202, the end portion of the second gas exhaust pipe 28 is provided in the lower layer portion 12b. By providing the end portion of the second gas exhaust pipe 28 in the lower layer portion 12b, it is possible to efficiently exhaust the residual gas from a specific region where the residual gas tends to remain in the lower layer portion 12b, for example.

Third Modification Example

A film forming apparatus according to a third modification example of the third embodiment is different from the film forming apparatus according to the third embodiment in that the first exhaust device and the second exhaust device are the same exhaust device.

Figure 29:
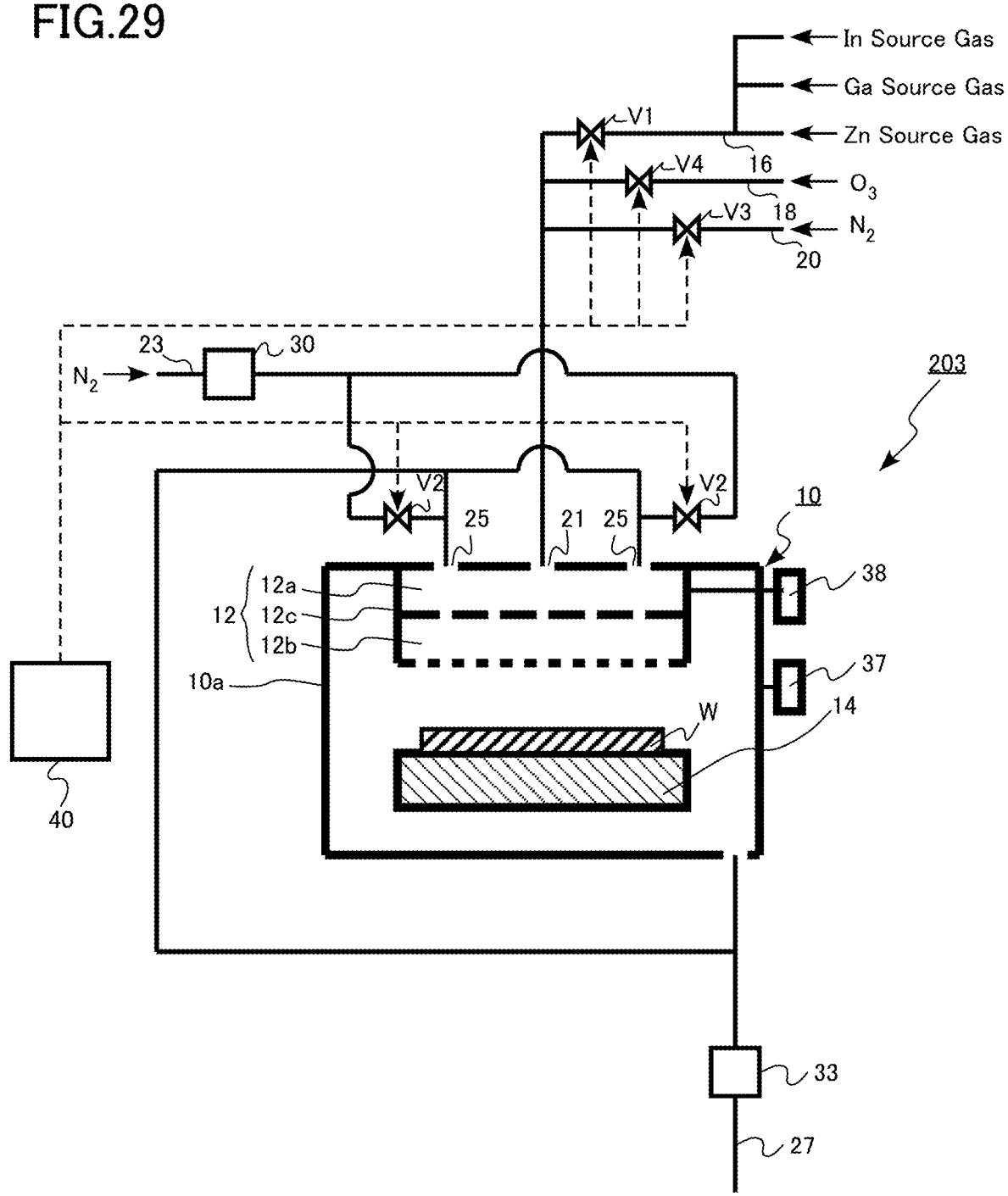
FIG. 29 is a schematic diagram of a film forming apparatus according to a third modification example of the third embodiment.

FIG. 29 is a schematic diagram of the film forming apparatus according to the third modification example of the third embodiment. The film forming apparatus according to the third modification example is a film forming apparatus 203 that forms a film using ALD.

In the film forming apparatus 203, the second gas exhaust pipe 28 is connected to the first exhaust device 33, and the second exhaust device 34 is not provided. According to the film forming apparatus 203, it is possible to simplify the apparatus configuration.

As described above, according to the film forming apparatus and the film forming method according to the third embodiment, it is possible to shorten the film formation time.

Fourth Embodiment

A film forming apparatus according to a fourth embodiment is different from the film forming apparatus according to the third embodiment in that the control circuit performs control to open the first valve after a first time passes from the opening of the second valve and the control circuit performs control to close the first valve after a second time passes from the closing of the second valve. Hereinafter, the description of a part of the content overlapping the third embodiment may be omitted.

The film forming apparatus according to the fourth embodiment has the same configuration as the film forming apparatus 200 according to the third embodiment except for the configuration of the control unit 40. Hereinafter, the configuration of the film forming apparatus according to the fourth embodiment will be described with reference to FIG. 18 of the third embodiment.

The control unit 40 of the film forming apparatus according to the fourth embodiment performs control to open the first valve V1 provided in the first source gas supply pipe 16 after the first time passes from the opening of the second valve V2 provided in the exhaust control gas supply pipe 23. In addition, the control unit 40 of the film forming apparatus according to the fourth embodiment performs control to close the first valve V1 provided in the first source gas supply pipe 16 after the second time passes from the closing of the second valve V2 provided in the exhaust control gas supply pipe 23.

Figure 30:
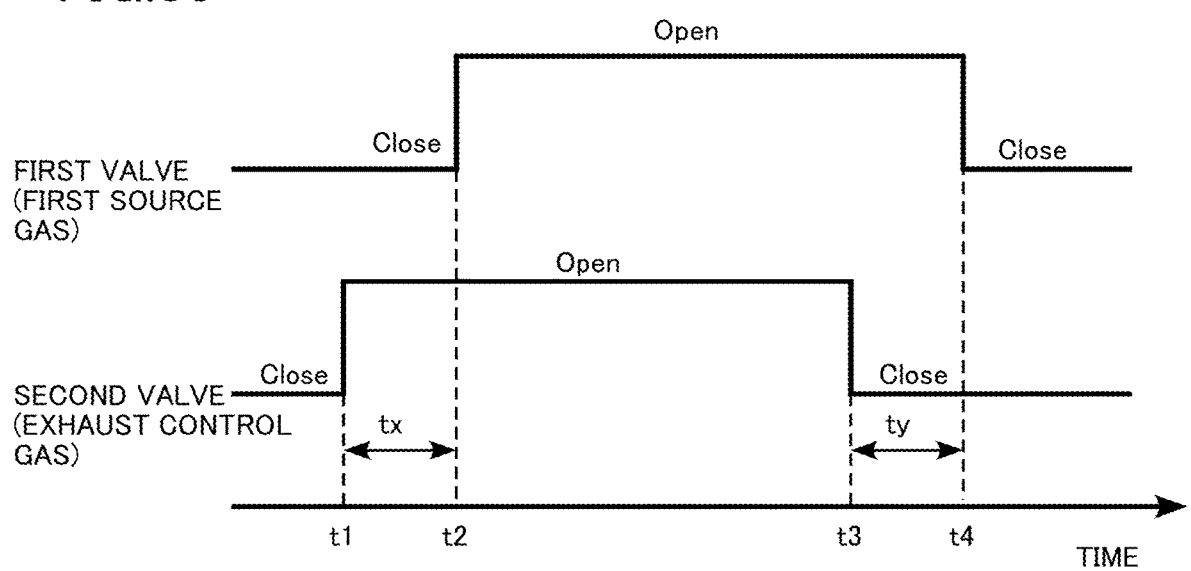
FIG. 30 is an explanatory diagram of a film forming method according to a fourth embodiment.

FIG. 30 is an explanatory diagram of a film forming method according to the fourth embodiment. FIG. 30 is a diagram showing the opening/closing timing of the first valve and the opening/closing timing of the second valve.

For example, when forming a film by supplying the first source gas from the first source gas supply pipe 16 into the chamber 10, as shown in FIG. 30, the first valve V1 provided in the first source gas supply pipe 16 is opened at time t2 after a first time (tx in FIG. 30) passes from the opening of the second valve V2 provided in the exhaust control gas supply pipe 23 at time t1. In addition, as shown in FIG. 30, the first valve V1 provided in the first source gas supply pipe 16 is closed at time t4 after a second time (ty in FIG. 30) passes from the closing of the second valve V2 provided in the exhaust control gas supply pipe 23 at time t3.

FIG. 31 is an explanatory diagram of the function and effect of the film forming apparatus and the film forming method according to the fourth embodiment. The upper diagram in FIG. 31 is a diagram showing the opening/closing timing of the first valve and the opening/closing timing of the second valve in the film forming method of a comparative example. The lower diagram in FIG. 31 shows a change in shower head pressure over time in the film forming method of the comparative example.

In the film forming method of the comparative example, when forming a film by supplying the first source gas from the first source gas supply pipe 16 into the shower head 12, as shown in the upper diagram in FIG. 31, the second valve V2 provided in the exhaust control gas supply pipe 23 is opened at time t1', and at the same time, the first valve V1 provided in the first source gas supply pipe 16 is opened. In addition, as shown in the upper diagram in FIG. 31, the second valve V2 provided in the exhaust control gas supply pipe 23 is closed at time t2', and at the same time, the first valve V1 provided in the first source gas supply pipe 16 is closed.

As shown in FIG. 31, when the first valve V1 and the second valve V2 are opened at the same time as in the comparative example, a delay of the first time tx occurs before the shower head pressure increases from the first pressure P1 to the desired second pressure P2. In other words, the responsiveness of the shower head pressure to the operation of the first valve V1 and the second valve V2 when increasing the shower head pressure is poor.

In addition, as shown in FIG. 31, when the first valve V1 and the second valve V2 are closed at the same time, a delay of the second time ty occurs before the shower head pressure decreases from the second pressure P2 to the desired first pressure P1. In other words, the responsiveness of the shower head pressure to the operation of the first valve V1 and the second valve V2 when decreasing the shower head pressure is poor.

If the responsiveness of the shower head pressure to the operation of the first valve V1 is poor, for example, the timing of starting and stopping the supply of the source gas deviates from the actual timing of film formation or vacuuming. As a result, it becomes difficult to control the film forming process. In addition, for example, there is a possibility that the cycle time becomes long and accordingly the film formation time becomes long.

FIG. 32 is an explanatory diagram of the function and effect of the film forming apparatus and the film forming method according to the fourth embodiment. The upper diagram in FIG. 32 is a diagram showing the opening/closing timing of the first valve and the opening/closing timing of the second valve in the film forming method according to the fourth embodiment. The lower diagram in FIG. 32 shows a change in shower head pressure over time.

As shown in FIG. 32, the second valve V2 is opened at time t1 and the first valve V1 is opened at time t2 after the first time tx passes from time t1, so that there is no delay for the shower head pressure to increase from the first pressure P1 to the desired second pressure P2. In other words, the responsiveness of the shower head pressure to the operation of the first valve V1 and the second valve V2 when increasing the shower head pressure is improved.

In addition, as shown in FIG. 32, the second valve V2 is closed at time t3 and the first valve V1 is closed at time t4 after the second time ty passes from time t3, so that there is no delay for the shower head pressure to decrease from the second pressure P2 to the desired first pressure P1. In other words, the responsiveness of the shower head pressure to the operation of the first valve V1 and the second valve V2 when decreasing the shower head pressure is improved.

By improving the responsiveness of the shower head pressure to the operation of the first valve V1 and the second valve V2, for example, the timing of starting and stopping the supply of the source gas matches the actual timing of film formation or vacuuming. As a result, it becomes easy to control the film forming process. In addition, for example, since the cycle time can be shortened, the film formation time can be shortened.

Next, a method for determining the first time tx and the second time ty in the film forming apparatus and the film forming method according to the fourth embodiment will be described.

Figure 33:
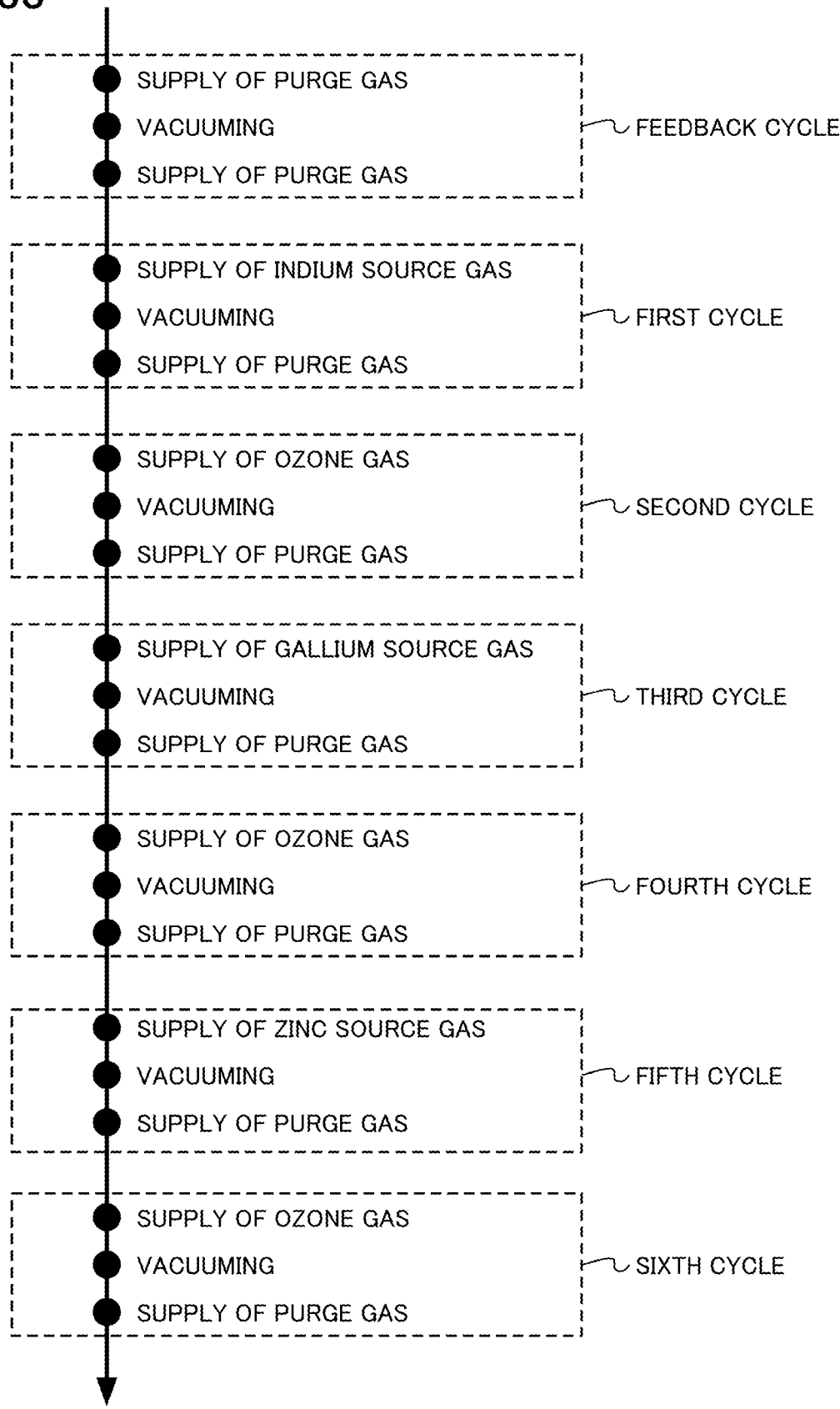
FIG. 33 is an explanatory diagram of the film forming method according to the fourth embodiment.

FIG. 33 is an explanatory diagram of the film forming method according to the fourth embodiment. FIG. 33 is a diagram showing a part of a process sequence when forming an indium gallium zinc oxide film by ALD.

As shown in FIG. 33, for example, a feedback cycle is performed before starting the film formation of the indium gallium zinc oxide film. By performing the feedback cycle, the first time tx and the second time ty are determined, and the first time tx and the second time ty are fed back to the cycle for film formation.

For example, the feedback cycle is performed before the first cycle. Specifically, before the second valve V2 provided in the exhaust control gas supply pipe 23 is opened to supply the nitrogen gas to the second gas exhaust pipe 28 and before the first valve V1 provided in the first source gas supply pipe 16 is opened to supply the indium source gas into the shower head 12, the feedback cycle is performed. The nitrogen gas is an example of the second gas. The indium source gas is an example of the first gas.

First, the semiconductor wafer W is loaded into the chamber 10. Then, the loaded semiconductor wafer W is placed on the holder 14.

Then, the pressure in the shower head 12 and the pressure in the chamber 10 are reduced to predetermined pressures by driving the first exhaust device 33 and the second exhaust device 34. At this time, the semiconductor wafer W is heated by, for example, a heater (not shown).

Then, the second valve V2 provided in the exhaust control gas supply pipe 23 and the third valve V3 provided in the purge gas supply pipe 20 are opened at the same time.

By opening the second valve V2, a nitrogen gas, which is an example of the exhaust control gas, is supplied from the exhaust control gas supply pipe 23 to the second gas exhaust pipe 28. By supplying the nitrogen gas into the second gas exhaust pipe 28, the exhaust of the gas from the shower head 12 is stopped to increase the pressure in the shower head 12. The exhaust control gas supply pipe 23 is an example of the second gas supply pipe. The nitrogen gas is an example of the second gas.

In addition, by opening the third valve V3, a nitrogen gas, which is an example of the purge gas, is supplied into the chamber 10 through the shower head 12. The purge gas supply pipe 20 is an example of the third gas supply pipe. The nitrogen gas is an example of the third gas.

After a predetermined time passes, the second valve V2 provided in the exhaust control gas supply pipe 23 and the third valve V3 provided in the purge gas supply pipe 20 are closed at the same time.

By closing the second valve V2, the supply of the nitrogen gas to the second gas exhaust pipe 28 is stopped. By stopping the supply of the nitrogen gas to the second gas exhaust pipe 28, the exhaust of the gas from the shower head 12 is started to reduce the pressure in the shower head 12.

In addition, the third valve V3 provided in the purge gas supply pipe 20 is closed. By closing the third valve V3, the supply of the nitrogen gas into the shower head 12 is stopped.

The supply of the nitrogen gas into the shower head 12 is stopped to vacuum the shower head 12 and the chamber 10.

Then, the third valve V3 provided in the purge gas supply pipe 20 is opened. By opening the third valve V3, a nitrogen gas, which is an example of the purge gas, is supplied into the chamber 10 through the shower head 12.

Then, the third valve V3 provided in the purge gas supply pipe 20 is closed. The supply of the nitrogen gas into the chamber 10 is stopped, and the purging process for the shower head 12 and the chamber 10 ends.

As described above, the feedback cycle shown in FIG. 33 ends. No film is formed on the semiconductor wafer W during the feedback cycle because the source gas does not flow. Thereafter, for example, a first cycle, a second cycle, a third cycle, a fourth cycle, a fifth cycle, and a sixth cycle are performed to form an indium gallium zinc oxide film.

In addition, during the feedback cycle, the shower head pressure is monitored by using the second pressure gauge 38.

FIG. 34 is an explanatory diagram of the film forming method according to the fourth embodiment. The upper diagram in FIG. 34 shows the opening/closing timing of the third valve and the opening/closing timing of the second valve in the feedback cycle. The lower diagram in FIG. 34 shows a change in shower head pressure over time.

In the feedback cycle, the first time tx for the shower head pressure to increase from the first pressure P1 to the desired second pressure P2 after the third valve V3 and the second valve V2 are opened at the same time is measured. In addition, the second time ty for the shower head pressure to decrease from the second pressure P2 to the desired first pressure P1 after the third valve V3 and the second valve V2 are closed at the same time is measured.

The measured first time tx and second time ty are stored in the storage device of the control unit 40, for example. For example, in the first, second, third, fourth, fifth, and sixth cycles following the feedback cycle, film formation is performed based on the first time tx and the second time ty stored in the storage device of the control unit 40.

The first time tx and the second time ty measured in the feedback cycle may not necessarily match the first time tx and the second time ty applied to the subsequent film formation cycle. For example, by performing predetermined arithmetic processing on the first time tx and the second time ty measured in the feedback cycle, the first time tx and the second time ty applied to the subsequent film formation cycle may be determined.

In addition, the third gas containing an inert gas used in the feedback cycle is not limited to the nitrogen gas. For example, an argon gas, a xenon gas, or a neon gas can be used. In addition, in the fourth embodiment, the purge gas supplied from the purge gas supply pipe 20 is used as the third gas containing the inert gas. However, for example, a configuration in which a separate gas supply pipe dedicated to the feedback cycle is provided is also possible.

Although the case where both the second valve V2 and the third valve V3 are opened and closed in the feedback cycle has been described as an example, it is also possible to open and close only either the second valve V2 or the third valve V3, for example.

In the film forming method according to the fourth embodiment, the frequency of performing a feedback cycle is arbitrary. For example, it is also possible to always perform a feedback cycle during film formation. In addition, for example, it is possible to perform a feedback cycle every predetermined number of film formations. In addition, for example, by continuously performing a plurality of feedback cycles, the first time tx and the second time ty can be set to the average value of the first time tx and the average value of the second time ty of a plurality of feedback runs, respectively.

As described above, according to the film forming apparatus and the film forming method according to the fourth embodiment, it is possible to shorten the film formation time.

In the first to fourth embodiments, the case of forming an indium gallium zinc oxide film has been described as an example, but the film to be formed is not limited to the indium gallium zinc oxide film.

While certain embodiments have been described, these embodiments have been presented by way of example only, and are not intended to limit the scope of the inventions. Indeed, the film forming apparatus and the film forming method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A film forming method using a film forming apparatus including a chamber including a sidewall, a shower head provided in an upper part of the chamber, a holder provided in the chamber holding a substrate, a first gas supply pipe supplying a first gas to the shower head, a first valve provided in the first gas supply pipe, a gas supply portion provided in a region of the chamber other than the shower head, a second gas supply pipe supplying a second gas to the gas supply portion, a second valve provided in the second gas supply pipe, a gas exhaust pipe exhausting a gas from the chamber, and an exhaust device connected to the gas exhaust pipe, the method comprising:
    loading a substrate into the chamber;
    placing the substrate on the holder;
    driving the exhaust device to reduce a pressure in the chamber;
    opening the second valve to supply the second gas containing an inert gas from the second gas supply pipe into the chamber through the gas supply portion;
    opening the first valve to supply the first gas containing a metal element into the chamber through the shower head;
    closing the second valve;
    closing the first valve; and
    reducing the pressure in the chamber,
    wherein the opening the first valve to start supply of the first gas is performed after a first time passes from the opening the second valve to start supply of the second gas, and the closing the first valve to stop supply of the first gas is performed after a second time passes from the closing the second valve to stop supply of the second gas.

2. The film forming method according to claim 1,
    wherein the film forming apparatus further includes:
        a third gas supply pipe supplying a third gas to the shower head; and
        a third valve provided in the third gas supply pipe,
    and
    the film forming method further comprising before the opening the second valve and before the opening the first valve:
        reducing a pressure in the chamber by driving the exhaust device;
        opening at least one of the third valve and the second valve to supply the second gas containing an inert gas from the second gas supply pipe into the chamber through the gas supply portion or to supply the third gas containing an inert gas into the chamber through the shower head;
        closing the at least one of the third valve and the second valve;
        determining the first time based on a time taken for the pressure in the chamber to increase to a predetermined pressure after the opening the at least one of the third valve and the second valve; and
        determining the second time based on a time taken for the pressure in the chamber to decrease to a predetermined pressure after closing the at least one of the third valve and the second valve at the same time.

3. A film forming method using a film forming apparatus including a chamber, a shower head provided in an upper part of the chamber and a gas supply hole and a gas exhaust hole being provided in the shower head, a holder provided in the chamber holding a substrate, a first gas supply pipe connected to the gas supply hole supplying a first gas to the shower head, a first valve provided in the first gas supply pipe, a first gas exhaust pipe exhausting a gas from the chamber, a second gas exhaust pipe connected to the gas exhaust hole exhausting a gas from the shower head, a second gas supply pipe supplying a second gas to the second gas exhaust pipe, a second valve provided in the second gas supply pipe, a first exhaust device connected to the first gas exhaust pipe, and a second exhaust device connected to the second gas exhaust pipe, the method comprising:
    loading a substrate into the chamber;
    placing the substrate on the holder;
    driving the first exhaust device to reduce a pressure in the chamber;
    driving the second exhaust device to reduce a pressure in the shower head;

opening the second valve to supply the second gas containing an inert gas from the second gas supply pipe to the second gas exhaust pipe;

opening the first valve to supply the first gas containing a metal element into the chamber through the shower head;

closing the second valve;

closing the first valve; and reducing the pressure in the shower head and the pressure in the chamber.

4. The film forming method according to claim 3, wherein the opening the first valve to start supply of the first gas is performed after a first time passes from the opening the second valve to start supply of the second gas, and the closing the first valve to stop supply of the first gas is performed after a second time passes from the closing the second valve to stop supple of the second gas.

5. The film forming method according to claim 4, wherein the film forming apparatus further includes:

a third gas supply pipe supplying a third gas to the shower head; and a third valve provided in the third gas supply pipe, and the film forming method further comprising before the opening the second valve and before the opening the first valve:

reducing a pressure in the chamber by driving the first exhaust device, reducing a pressure in the shower head by driving the second exhaust device, opening at least one of the third valve and the second valve to supply the second gas containing an inert gas from the second gas supply pipe to the second gas exhaust pipe or to supply the third gas containing an inert gas into the chamber through the shower head, closing the at least one valve, determining the first time based on a time taken for the pressure in the shower head to increase to a predetermined pressure after the opening the at least one of the third valve and the second valve, and determining the second time based on a time taken for the pressure in the shower head to decrease to a predetermined pressure after the closing the at least one of the third valve and the second valve at the same time.

* * * * *